United States Patent [19]
Isomura et al.

[11] Patent Number: 5,898,636
[45] Date of Patent: Apr. 27, 1999

[54] SEMICONDUCTOR INTEGRATED CIRCUIT DEVICE WITH INTERLEAVED MEMORY AND LOGIC BLOCKS

[75] Inventors: Satoru Isomura; Atsushi Shimizu; Keiichi Higeta, all of Ohme; Tohru Kobayashi, Iruma, all of Japan; Takeo Yamada, Cambridge, Mass.; Yuko Ito, Hamura, Japan; Kengo Miyazawa, Ohme, Japan; Kunihiko Yamaguchi, Sayama, Japan

[73] Assignee: Hitachi, Ltd., Tokyo, Japan

[21] Appl. No.: 08/255,240

[22] Filed: Jun. 7, 1994

[30] Foreign Application Priority Data

Jun. 21, 1993 [JP] Japan .................................... 5-173806
Sep. 13, 1993 [JP] Japan .................................... 5-251182

[51] Int. Cl.⁶ .................................................. H01L 21/82
[52] U.S. Cl. .............................. 365/230.03; 365/189.08; 257/205; 257/210; 257/202; 257/203
[58] Field of Search ........................ 365/230.01, 230.02, 365/230.03, 189.03, 189.08; 257/202, 203, 205, 210

[56] References Cited

U.S. PATENT DOCUMENTS

| | | | |
|---|---|---|---|
| 5,040,152 | 8/1991 | Voss et al. ........................ | 365/230.03 |
| 5,097,450 | 3/1992 | Toda et al. ........................ | 365/230.03 |
| 5,150,330 | 9/1992 | Hag .................................... | 365/230.03 |
| 5,280,450 | 1/1994 | Nakagome et al. ............... | 365/189.03 |
| 5,386,387 | 1/1995 | Tanizaki ............................ | 365/200 |

FOREIGN PATENT DOCUMENTS 3-062963  3/1991  Japan .
3-205872  9/1991  Japan .

OTHER PUBLICATIONS

Kubo, Seiji. "BiCMOS Technology," Sep. 20, 1990, pp. 146–151. (Provided in Japanese with English translation attached).

Nikkei Electronics, Nikkei–McGraw–Hill, Sep. 9, 1985, pp. 165–169 and 175–176. (Provided in Japanese with English translation attached).

*Primary Examiner*—Viet Q. Nguyen
*Attorney, Agent, or Firm*—Fay, Sharpe, Beall, Fagan, Minnich, & McKee

[57] ABSTRACT

A semiconductor integrated circuit device having a memory portion and a logic circuit portion formed with a same semiconductor substrate comprising a first logic circuit block, a second logic circuit block disposed in an area different from an area in which the first logic circuit block is disposed, and a pair of memory blocks oppositely disposed so that the second logic circuit block comes in between. Data stored in the pair of memory blocks are transmitted to the second logic circuit block for processing via a memory peripheral circuit provided on the second logic circuit block. A result of the data processing is transmitted to the first logic circuit block or an external device via an input/output circuit provided in the second logic circuit block.

13 Claims, 19 Drawing Sheets

PIN ASSIGNMENT

SEMICONDUCTOR INTEGRATED CIRCUIT DEVICE WITH INTERLEAVED MEMORY AND LOGIC BLOCKS

BACKGROUND OF THE INVENTION

The present invention relates to a semiconductor integrated circuit device and, more particularly, to a technology effectively applicable to an LSI (Large Scale Integration) having a logic circuit block and a memory block formed on a single semiconductor substrate.

There is known, as a semiconductor integrated circuit device having a logic circuit block and a memory block, a rectangular semiconductor chip arranged at an end portion of a main surface thereof with a RAM (Random Access Memory) and with the logic circuit block at a center of the chip as described in "BiCMOS Technology," Seiji Kubo, Sep. 20, 1990, pp 146 to 151, Electronic Information Communications Association, by way of example.

The present invention also relates to a method of laying out many functional circuit blocks on a chip of a semiconductor integrated circuit device and, more particularly, to a technology effectively applicable to a semiconductor integrated circuit device such as a gate array composed of an ECL (Emitter Coupled Logic) circuit and the like.

For designing technique of an ASIC (Application Specific Integrated Circuit), a standard cell method is known. In the standard cell method, standard cells previously designed are assembled to design an entire chip. Such a standard cell method is described in Nikkei Electronics, Sep. 9, 1985, pp 165–169 and 175–176, Nikkei-McGraw-Hill.

SUMMARY OF THE INVENTION

In a semiconductor integrated circuit device having the above-mentioned constitution, memory blocks (RAM) are located at one end portion or both end portions of the chip and a logic circuit block is located at the center of the chip, so that a distance between the memory blocks is relatively made long. Consequently, wiring lengths between the memory blocks and the logic circuit block when output data of the memory blocks are transmitted to the logic circuit block or when the logic circuit block controls the memory blocks are made relatively long, thereby making a signal propagation delay time of the chip relatively long.

Another problem with the conventional standard cell method is a poor integrity with a gate array, resulting in a wasted area and a wasted wiring on the chip. Still another problem is that there is no consideration for high-speed operation, resulting in a deteriorated operational margin as "clock frequency increases."

It is therefore an object of the present invention to provide a semiconductor integrated circuit device that allows an efficient circuit design and an efficient layout design while implementing a high-speed circuit, and provide a method of manufacturing such a semiconductor integrated circuit device.

The above and other objects, features and advantages of the present invention will become more apparent from the accompanying drawings, in which like reference numerals are used to identify the same or similar parts in several views.

Representative examples of the present invention will be briefly described as follows. A semiconductor integrated circuit device according to the present invention comprises a plurality of first logic circuit blocks in which basic cells arranged in an array, a pair of memory blocks constituted with integrity kept with the plurality of first logic circuit blocks and input and output portions of the pair of memory blocks arranged oppositely, and a second logic circuit block formed in an area between the pair of memory blocks to transfer signals with the input and output portions.

A clock signal entered at the center portion of the semiconductor chip is supplied to a plurality of first stage clock distributing circuits equidistantly disposed from the center portion. The clock signal is then supplied to a plurality of second stage clock distributing circuits at least equidistantly disposed from each of the first stage clock distributing circuits. The clock signal is then supplied to a plurality of third stage clock distributing circuits equidistantly disposed from each of the second stage clock distributing circuits. The clock signal is then supplied to a plurality of final stage clock distributing circuits equidistantly disposed from each of the third stage clock distributing circuits. From these final stage clock distributing circuits, the clock signal is supplied to an area. An internal gate array and a RAM macro cell or a logic macro cell are made replaceable with each other in units of this area.

Further, the memory block can be set at any location for the logic circuit block to allow an efficient layout design. In addition, the constitution in which the logic circuit block is located between a pair of memory blocks provides a shortest possible data path between them, thereby increasing a processing speed of the semiconductor chip.

Still further, such circuits formed on a single semiconductor integrated circuit device as flip-flops that are driven by a clock pulse have no clock signal delay between them and therefore can be operated in synchronization, thereby increasing the processing speed. At the same time, since the gate array and the RAM macro cell or logic macro cell having a specific capability are the same in size, their combinations provide a good integrity, which in turn implements an efficient circuit layout.

DESCRIPTION OF THE PREFERRED EMBODIMENTS

This invention will be described in further detail by way of example with reference to the accompanying drawings.

Figure 1:
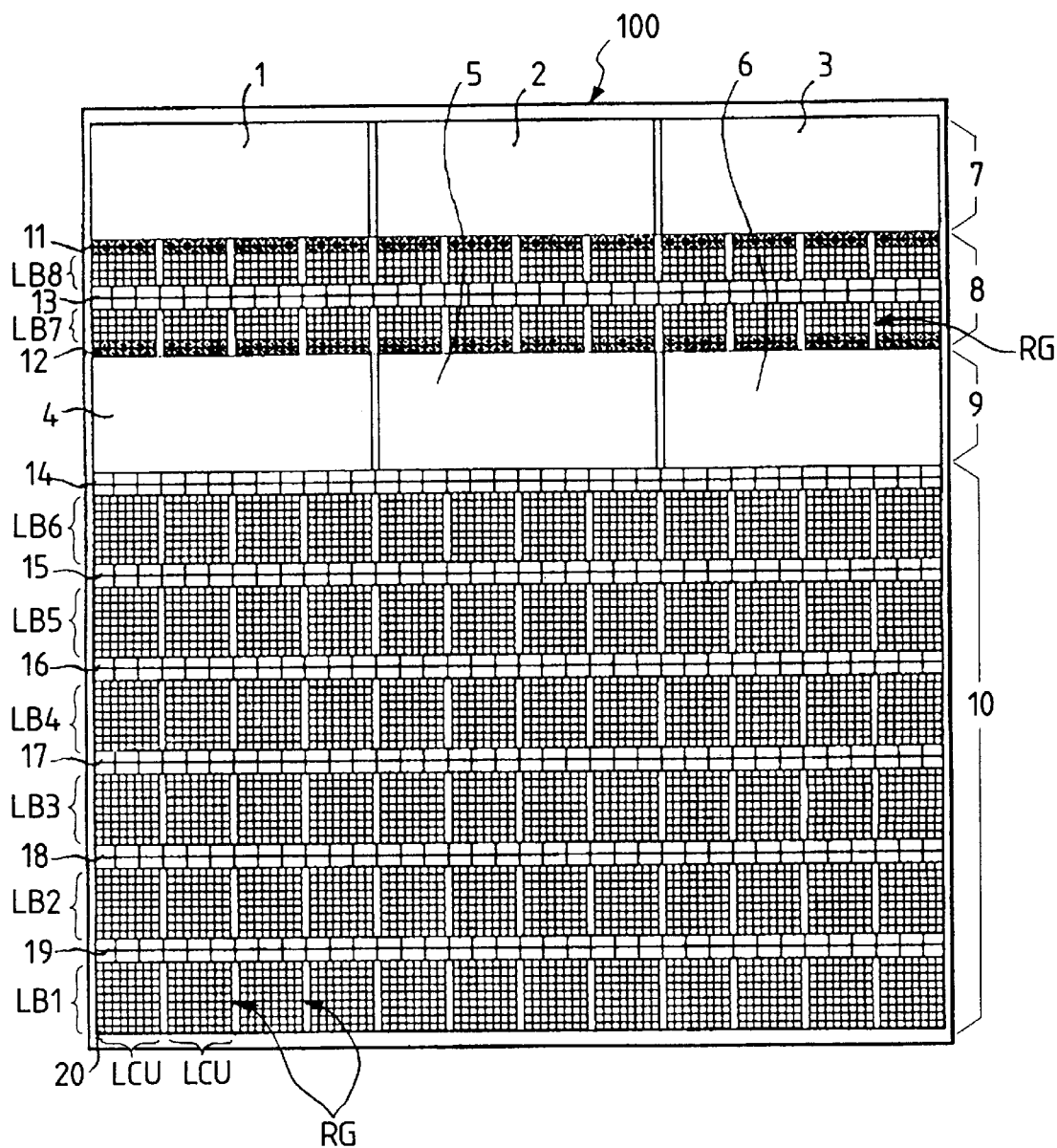
FIG. 1 is a schematic diagram illustrating the semiconductor integrated circuit device (logic LSI with memory) practiced as one preferred embodiment of the invention.

Referring to FIG. 1, there is shown a diagram illustrating an outline of a constitution of one preferred embodiment of a semiconductor integrated circuit device (a logic LSI with memory) associated with the present invention. In the figure, a rectangular base chip 100 is formed on a main surface thereof with logic circuit blocks 10 and 8 composed of gate arrays and with memory blocks 7 and 9 including three pairs of memory portions 1 through 6 composed of static RAMs (Random Access Memories).

Each of the logic circuit blocks 10 and 8 is composed of an array of a plurality of basic cells 20. The logic circuit block 10 is divided into a plurality of logic circuit rows LB1 through LB6 by a plurality of stripe-like I/O (Input/Output) rows 15 through 19 while the logic circuit block 8 is divided into a plurality of logic circuit rows LB7 and LB8 by a stripe-like I/O row 13. Further, each of the logic circuit rows LB1 through LB8 is divided into a plurality of logic circuit cell units LCUs by reference voltage generating circuits RGs that run vertically relative to the I/O rows.

In the above-mentioned embodiment, the memory blocks 1 through 6 are arranged so that the blocks 1 and 4, the blocks 2 and 5, and the blocks 3 and 6 are paired. The horizontally running three memory portions 1 through 3 constitute the memory block 7, while the horizontally running three memory blocks 4 through 6 constitute the memory block 9. Thus, the memory blocks 7 and 9 are arranged on the chip in a pair. A lateral size of each of the above-mentioned memory portions 1 through 6 is equivalent to a total size of four logic circuit cell units LCUs, maintaining integrity in layout with the logic circuit blocks 10 and 8 on the above-mentioned logic chip. Between the logic block 8 and the above-mentioned memory blocks 7 and 9, there are provided I/O portions 11 and 12 as interface circuits. Data processing and control for the memory portions are performed by the above-mentioned logic circuit block 8.

By providing the integrity in layout of the above-mentioned memory portions 1 through 6 and the I/O portions 11 and 12 thereof for the logic circuit blocks composed of gate arrays, a variety of combinations of RAMs can be created for storage sizes required for memory blocks to be mounted on a semiconductor integrated circuit device. That is, a pair of memory cell blocks equivalent to four logic circuit cell units (two units×two units) in size is formed as a minimum unit (this is called a macro cell) and an integral number of memory blocks is designed beforehand within a range of the size of the above-mentioned base chip. This novel constitution can enhance efficiencies of design and development processes corresponding to a variety of semiconductor integrated circuit device specifications.

The semiconductor integrated circuit device containing memory blocks according to the present invention comprises a first logic circuit block 10 composed of gate arrays, a pair of memory blocks 7 and 9, and a second logic circuit block 8 formed in an area between the above-mentioned memory blocks. Thus, dividing a logic circuit into two blocks and arranging the memory blocks so that one of the divided logic circuit blocks is formed between the memory blocks can rationally perform signal processing in the logic circuit portion and signal processing in the memory block portion and shorten the signal propagation distance in these portions, thereby increasing a processing speed of the semiconductor integrated circuit device substantially.

If the memory blocks 7 and 9 are arranged at opposite ends of the chip, comparison of data stored in these memory blocks must be performed over a longer signal propagation distance, thereby resulting in a slower processing speed. According to the present invention, however, providing the logic circuit block 8 having an input/output circuit between the memory blocks can effectively enhance the processing speed.

Figure 2:
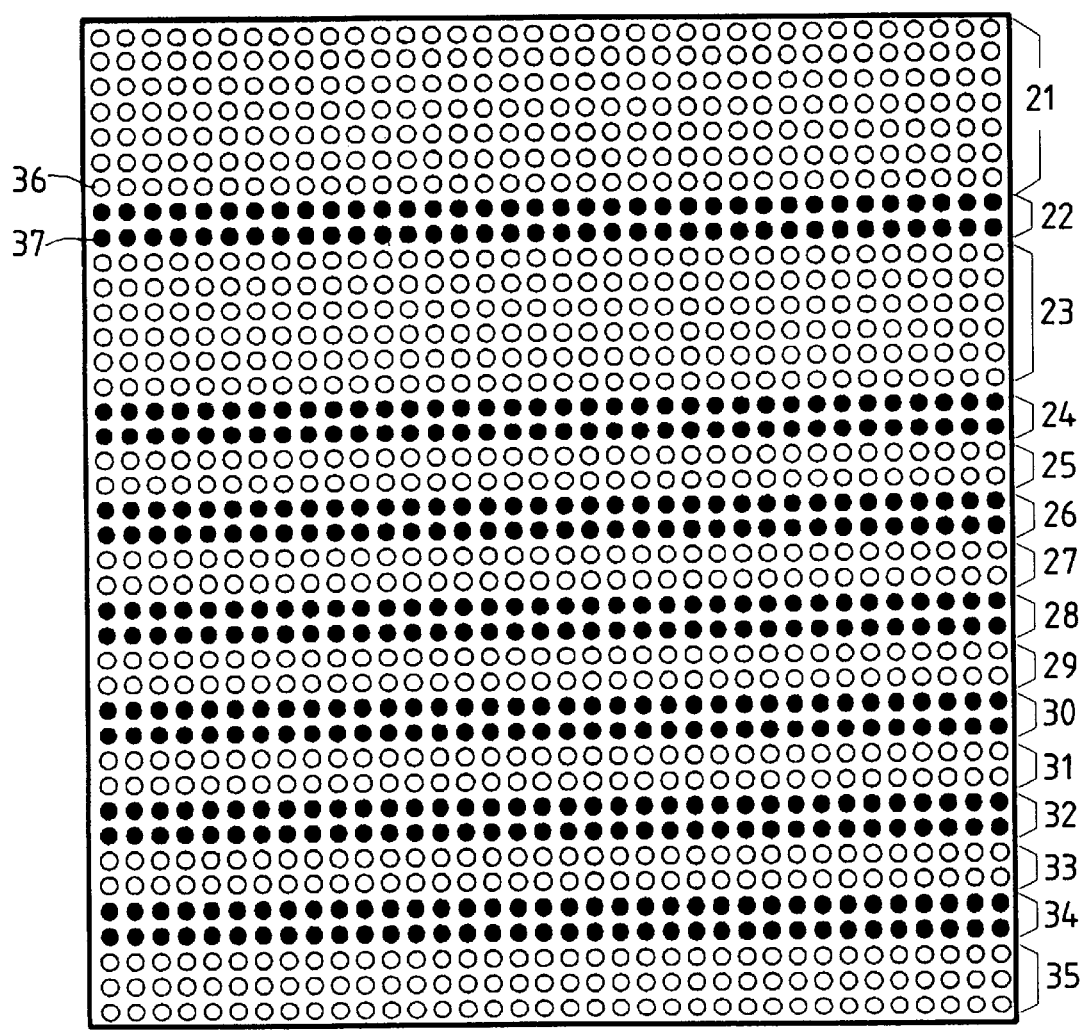
FIG. 2 is a view illustrating an arrangement of a preferred embodiment of solder bumps serving as input/output terminals of the semiconductor integrated circuit device of FIG. 1.

Referring to FIG. 2, there is shown a layout of solder bumps serving as input/output terminals and power supply terminals of the above-mentioned semiconductor integrated circuit device. These terminals are arranged over an entire surface of the chip in arrays and are connected to each other by CCB (Controlled Collapse Bonding) for a mounting board such as a printed circuit board.

Black dots 37 provided for the I/O rows of FIG. 1 indicate the input/output terminals. These input/output terminals are used as external terminals at which signals are inputted and outputted. White dots 36 are used as external terminals for supplying power. To be more specific, solder bumps 22, 24, 26, 28, 30, 32, and 34 provided for the input/output circuit rows 13 through 19 of FIG. 1 service as signal connection, while solder bumps 21, 23, 25, 27, 29, 31, 33, and 35 provided in other areas serve as power connection.

Figure 3:
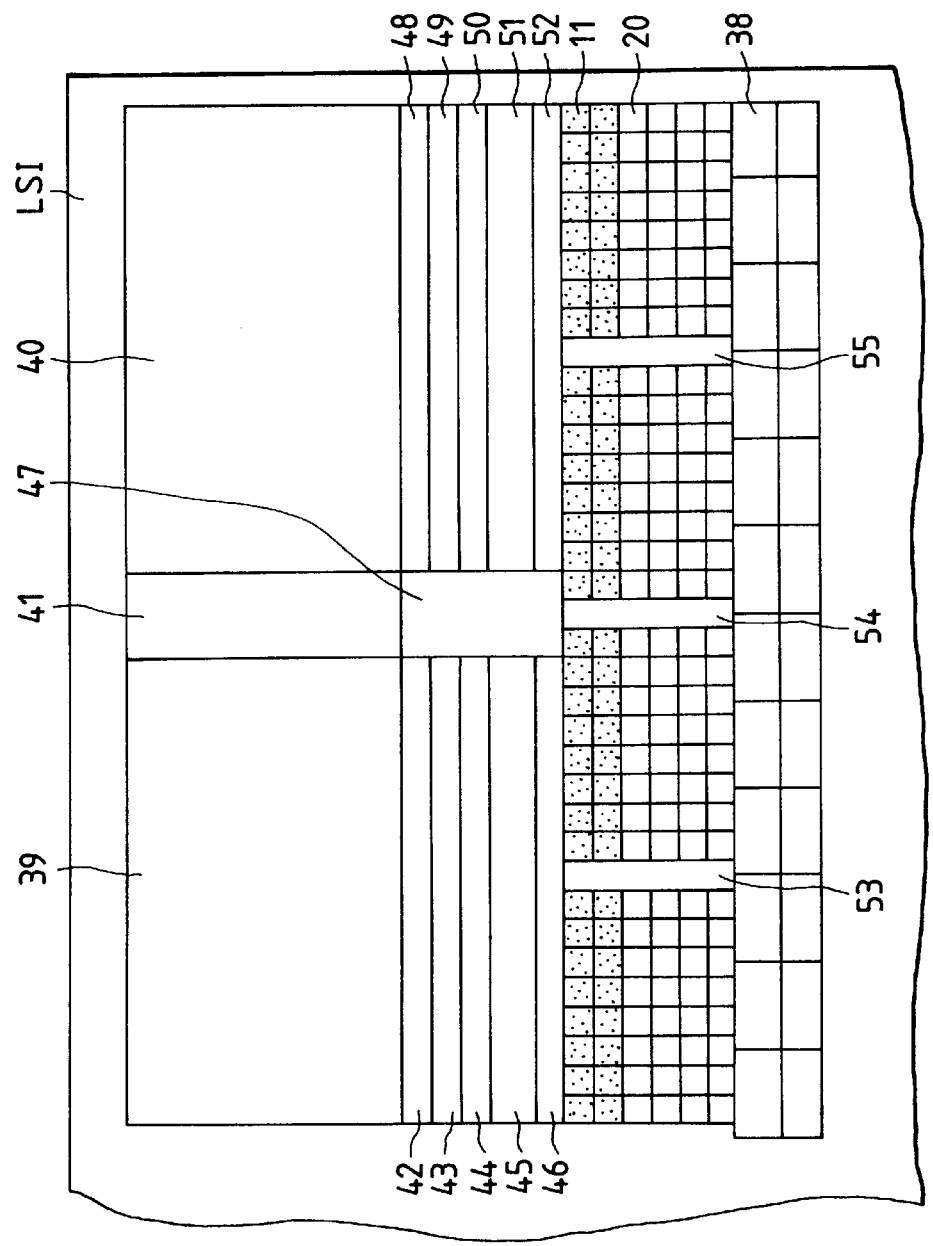
FIG. 3 is an expanded block diagram illustrating a memory circuit and a periphery thereof mounted on the semiconductor integrated circuit device of FIG. 1.

Referring to FIG. 3, there is shown a expanded block diagram illustrating a part of the above-mentioned memory portion and a periphery thereof. Each circuit block in FIG. 3 is depicted in accordance with an actual geometrical arrangement on a semiconductor substrate. The memory portion (RAM macro cell) of this embodiment is composed of a static RAM including a pair of CMOS inverter circuit in which memory cells are mutually cross-coupled) but not limited thereto, for higher integration and power saving. This setup allows to form a RAM macro cell having a relatively large storage size in a comparatively small area.

The memory portion is composed of a pair of circuits disposed in a horizontally symmetrical manner. Memory cell arrays 39 and 40 are arranged with the above-mentioned memory CMOS memory cells in a matrix manner. In an area between the memory cell arrays 39 and 40, a word line driver 41 is provided. The word line driver 41 is shared between the above-mentioned memory cell arrays 39 and 40 arranged symmetrically. Below the word line driver 41, an address decoder 47 is provided.

The memory cell array 39 is provided with a sense circuit 42 for amplifying a signal of its complementary bit line (or data line). The complementary bit line is selected by a bit line switching circuit 43 (column selecting switch). Switching by the bit line switching circuit 43 is controlled by a select signal generated by a bit line selector 44. A write circuit 45 is provided via the bit line switching circuit 43. The write circuit 45 gets write data from an input circuit to be described to supply write signals of high and low levels to the complementary bit line selected by the bit line switching circuit 43. Thus, the data is written to a memory cell connected to the selected complementary bit line and a selected word line.

A power supply circuit 46 generates a supply voltage and a reference voltage necessary for operations of the above-mentioned memory cells, sense circuit, and write circuit. Likewise, the memory cell array 40 is provided with a sense circuit 48, a bit line switching circuit 49, a bit line selector 50, a write circuit 51, and a power supply circuit 52. The address decoder 47 formed in the area between the memory cell arrays 39 and 40 generates the above-mentioned word line select signal and bit line select signal.

A logic circuit is composed of a gate array using the above-mentioned basic cells 20 to generate a control signal for the input/output circuits 11 and the above-mentioned memory portion, create data accordingly, and perform data comparison and transfer control between the memory circuits. The above-mentioned input/output circuits 11 are also composed of above-mentioned basic cells 20 or basic cells of equivalent size, but not limited thereto. The above-mentioned constitution allows the flexible setting of the number of data bits for input/output data and the above-mentioned memory capability and provides integrity with the gate arrays.

Reference numeral 38 indicates input/output circuits corresponding to the above-mentioned input/output circuit row 13. The input/output circuits 38 capture data entered by means of an external terminal based on solder bump when the data is entered from an external terminal. When outputting data from the memory portion, the input/output circuits 38 outputs the data via the external terminal based on solder bump. Thus, for the input/output of data with the memory portion, the data transfer is performed with the memory portion over a shortest possible distance, thereby substantially increasing the speed of operation. Reference numerals 53 through 55 indicate power supply circuits that supply voltages necessary for the basic cells 20 and the input/output circuits 38.

Figure 4:
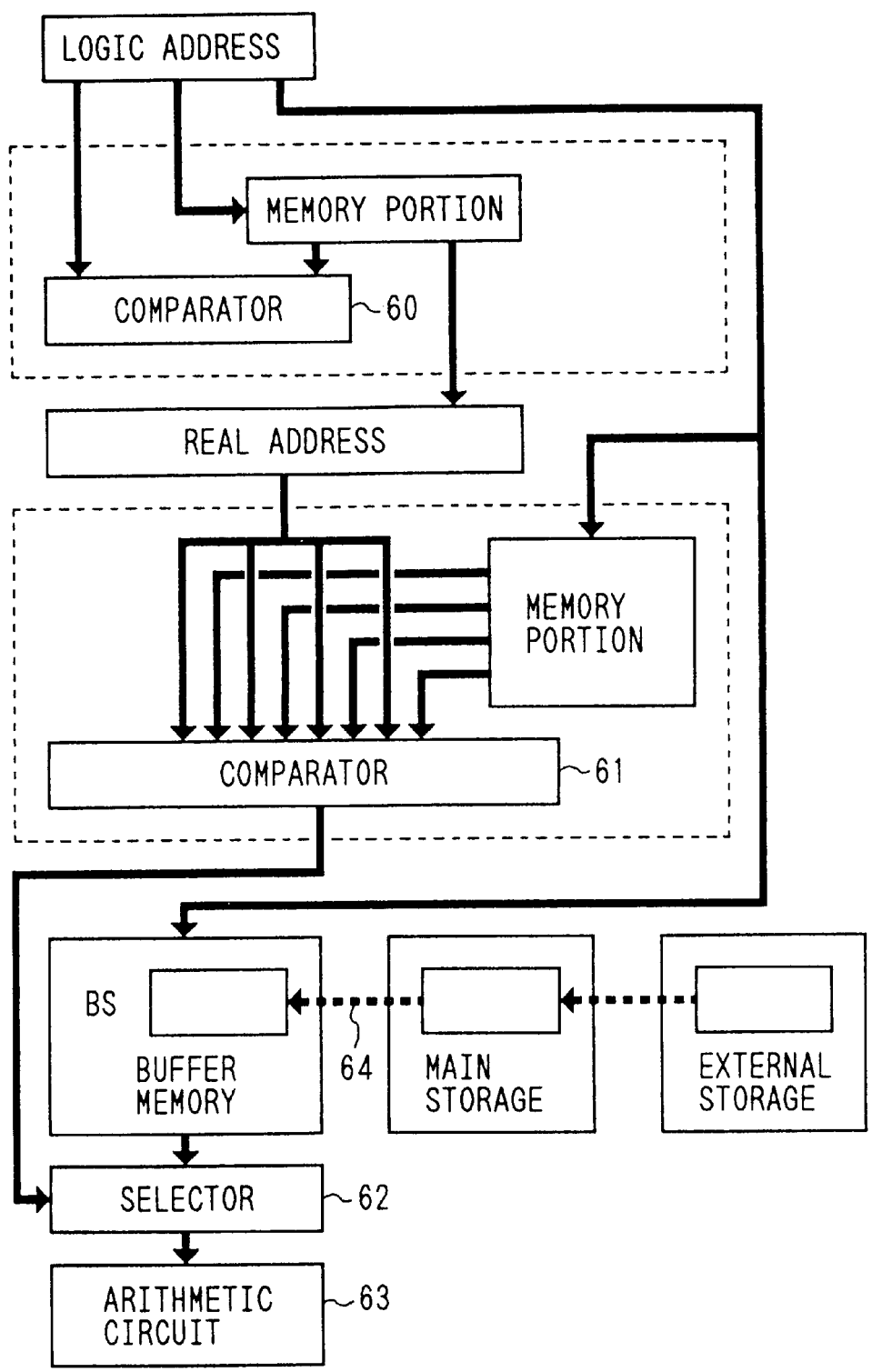
FIG. 4 is a block diagram illustrating a preferred embodiment of a memory control circuit provided on an electronic computer system constituted using the semiconductor integrated circuit device of FIG. 1.

Referring to FIG. 4, there is shown a block diagram illustrating one preferred embodiment of a memory controller mounted on an electronic computer system based on the semiconductor integrated circuit device associated with the present invention. The memory controller of this embodiment largely comprises a virtual address translator or translation buffer (TLB) and a buffer memory controller or buffer address array (BAA).

The virtual TLB translates an entered logic address to a real address by means of the memory portion and comparators. A comparator 60 provided in the virtual TLB compares a logic address for performing the above-mentioned processing in parallel with a memory output. A resultant real address is compared in the BAA with a buffer address control table composed of the memory portion by means of a comparator 61. A comparison result is used to select data of a buffer memory BS in a storage portion by means of a selector 62. Based on the selected data, an arithmetic operation is performed by an arithmetic circuit 63. A signal delay in this memory controller determines an execution time of an arithmetic instruction of the electronic computer system.

Figure 5:
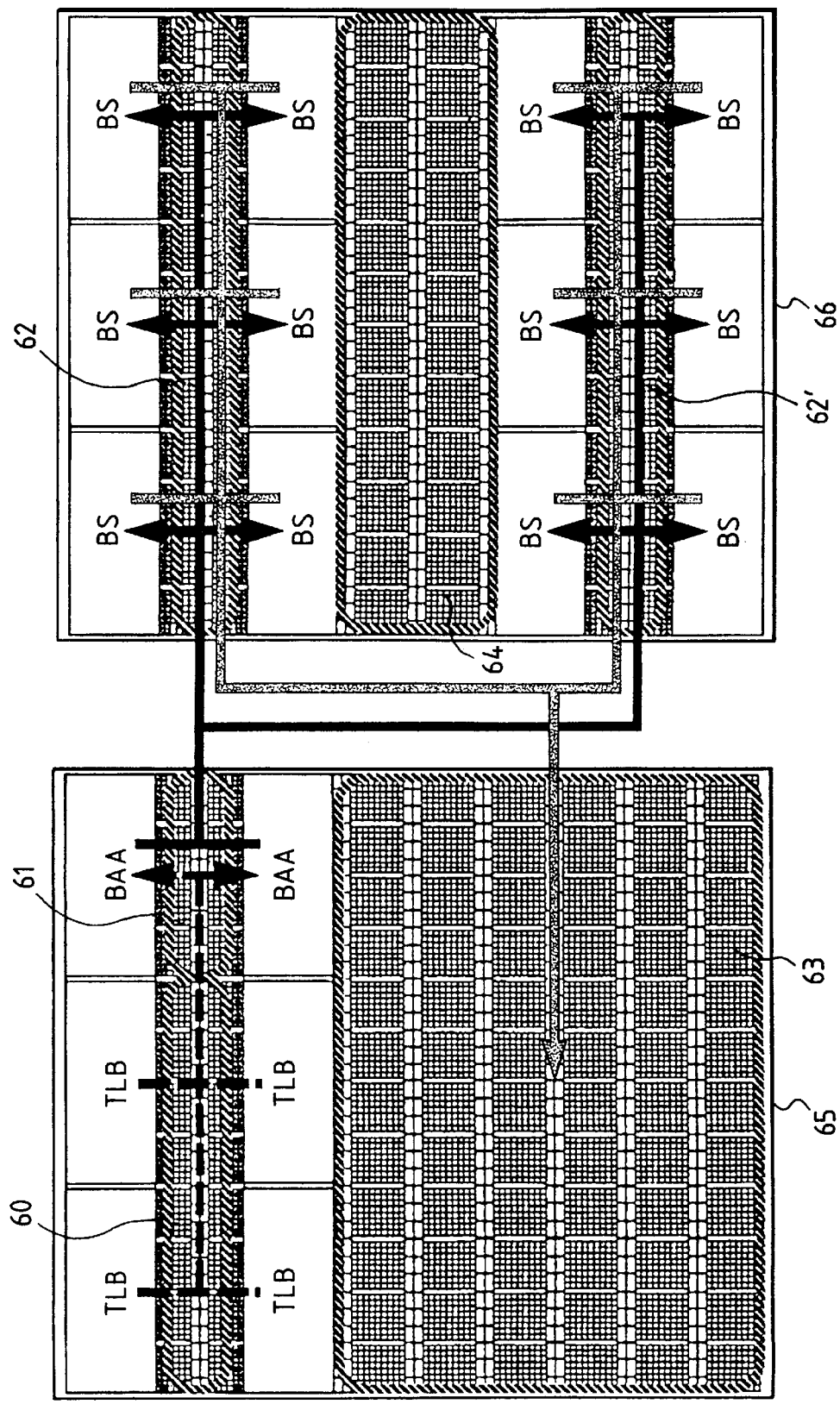
FIG. 5 is a layout diagram illustrating another preferred embodiment of the memory control circuit of FIG. 4 as constituted with two semiconductor integrated circuit devices.

Referring to FIG. 5, there is shown a layout of another embodiment of the above-mentioned memory controller comprising two semiconductor integrated circuit devices. In the figure, arrows are also drawn to indicate flows of data.

In FIG. 5, an upper semiconductor integrated circuit device 66 is formed with a buffer memory BS. In this embodiment, in order to provide the buffer memory BS of a relatively large storage size, the left end of the chip is formed with three pairs of memory blocks and the right end of the chip is formed with three pairs of memory blocks, each memory block being used as a buffer memory BS. The three pairs on the left end are formed with a selector 62 in between as shown. The selector 62 is composed of above-mentioned basic cells 20. Likewise, the three pairs on the right end are formed with a selector 62'. At the center of the chip, a write controller 64 is provided to transfer data with main storage.

A lower semiconductor integrated circuit device 65 in FIG. 5 is formed with virtual TLBs, buffer address arrays BAAs, and an arithmetic circuit 63. A memory block of the virtual TLB is used as a memory portion. An area between memory portions is formed with a comparator 60 composed of basic cells 20. A logic address is entered in the virtual TLB via an input/output portion. Likewise, a memory block of the BAA is used as a memory portion. An area between the memory portions is formed with a comparator 61 composed of basic cells 20. A real address generated therein is outputted via the input/output portion to be entered in an input/output circuit row corresponding to the selectors 62 and 62' of the above-mentioned semiconductor integrated circuit device via a printed wiring formed on a mounting board such as a printed circuit board, not shown.

The data selected by the input/output circuit row corresponding to the selectors 62 and 62' of the semiconductor integrated circuit device 66 is outputted to be entered over the above-mentioned printed wiring in the arithmetic circuit 63 of the semiconductor integrated circuit device 65 via an input/output circuit row thereof. The arithmetic circuit 63 combines the above-mentioned gate arrays to perform a data arithmetic operation corresponding to an arithmetic instruction. Thus, in the present embodiment, the above-mentioned memory controller comprises two semiconductor integrated circuit devices including the arithmetic circuit 63 and the signal propagation distance in each device is made shortest, thereby shortening the arithmetic instruction executing time of the electronic computer system.

Figure 6:
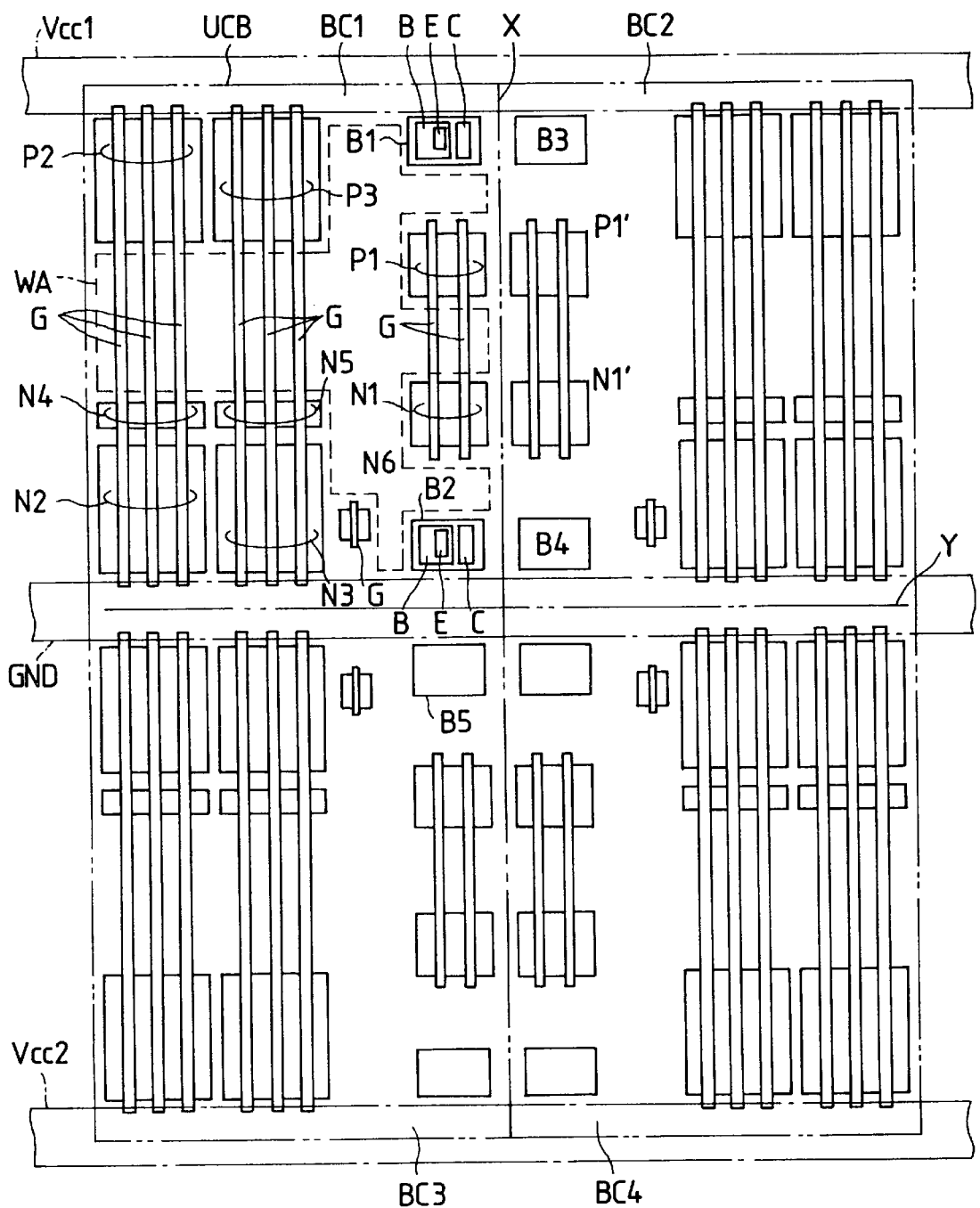
FIG. 6 is a device arrangement diagram illustrating a preferred embodiment of basic cells of the semiconductor integrated circuit device of FIG. 1.

Referring to FIG. 6, there is shown an element layout of one preferred embodiment of the above-mentioned basic cell 20. To be specific, FIG. 6 illustrates a layout of active elements in the basic cell constituting an gate array. The wiring for connecting the elements is omitted by master slicing. In a basic cell UCB of this embodiment, its circuit is arranged in a horizontally symmetrical manner around an X-line and a vertical symmetrical manner around a Y-line. That is, in FIG. 6, the basic cell UCB is composed of four circuit blocks BC1 through BC4. It should be noted that Vcc1, Vcc2, and GND indicate a layout of power supply wiring and are made of tungsten or aluminum for example.

Of the above-mentioned four basic circuit blocks, the upper left block is illustrated representatively. As shown, P1 and P2 indicate portions in which p-channel MOSFETs are formed. N1 through N6 indicate portions in which n-channel MOSFETs are formed. N-channel MOSFETs formed in N4 and N5 are made relatively small in their device size. For all of these MOSFETs, common gates G are formed to form a plurality of pairs of p-channel MOSFETs and n-channel MOSFETs of CMOS constitution. In addition, a small-sized n-channel MOSFET like N6 is separately formed at a lower center of the circuit block BC1. G indicates a gate of N6. B1 and B2 indicate areas in which bipolar transistors are formed. B indicates a base area, E indicates an emitter area, and C indicates a collector connection area. WA indicates a wiring area.

Figure 7:
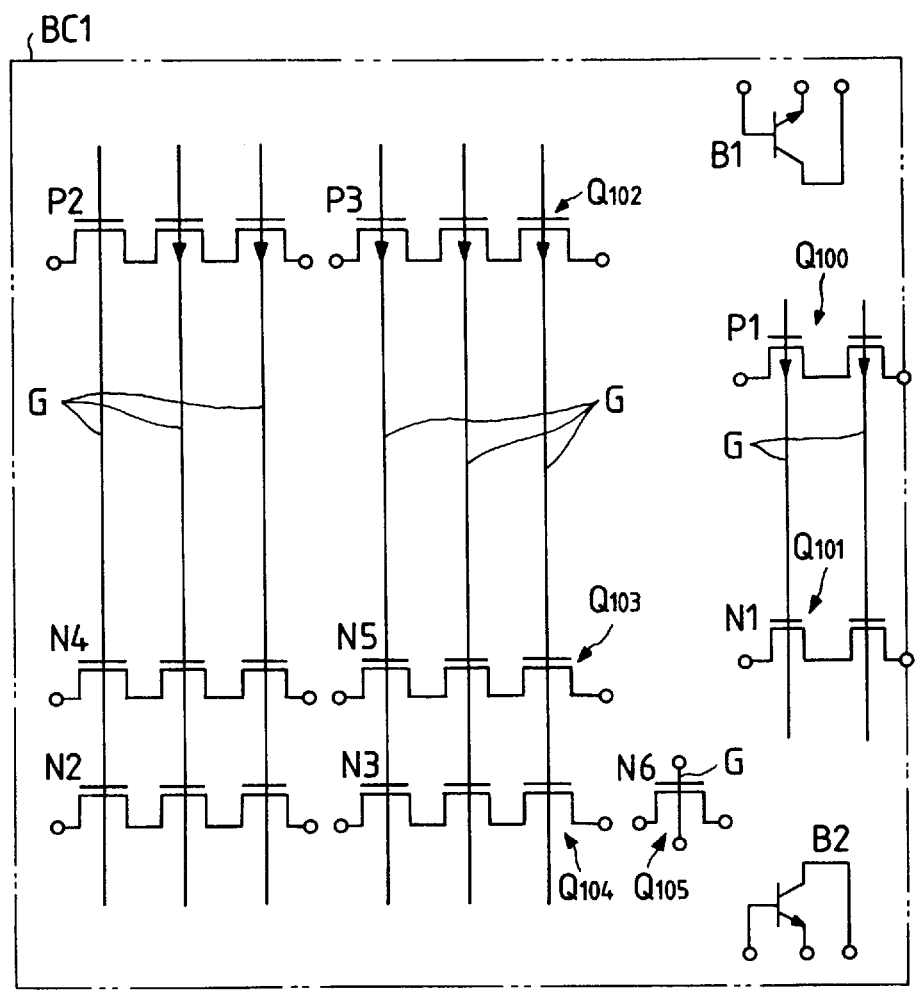
FIG. 7 is a diagram of a circuit equivalent to the basic cell of FIG. 6.

Referring to FIG. 7, there is shown a diagram illustrating a circuit equivalent to the circuit block BC1. In the figure, a layout of circuit elements is drawn in correspondence with the element layout of the circuit block BC1 of FIG. 6.

Referring to FIG. 7, a p-channel MOSFET $Q_{102}$ is the above-mentioned large-sized p-channel MOSFET, a MOSFET $Q_{103}$ is the above-mentioned small-sized n-channel MOSFET, a MOSFET $Q_{104}$ is a large-sized n-channel MOSFET, and a MOSFET $Q_{105}$ is a separately formed n-channel MOSFET. MOSFET $Q_{100}$ and $Q_{101}$ are mainly combined with bipolar transistors B1 and B2 arranged above and below them respectively to constitute a Bi-CMOS output circuit.

Figure 8:
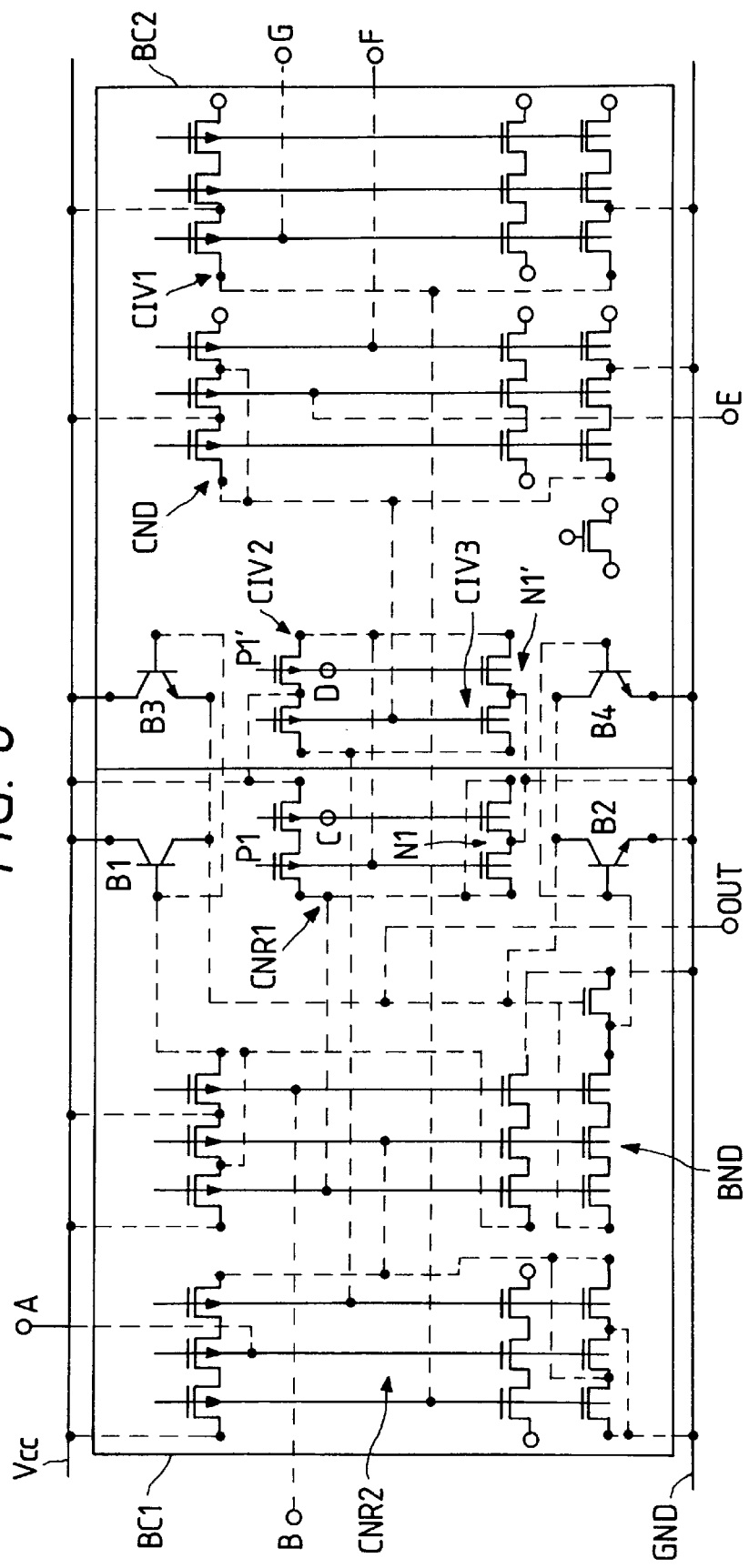
FIG. 8 is a wiring diagram illustrating a preferred embodiment of a logic circuit constituted using the basic cell of FIG. 6.
Figure 9:
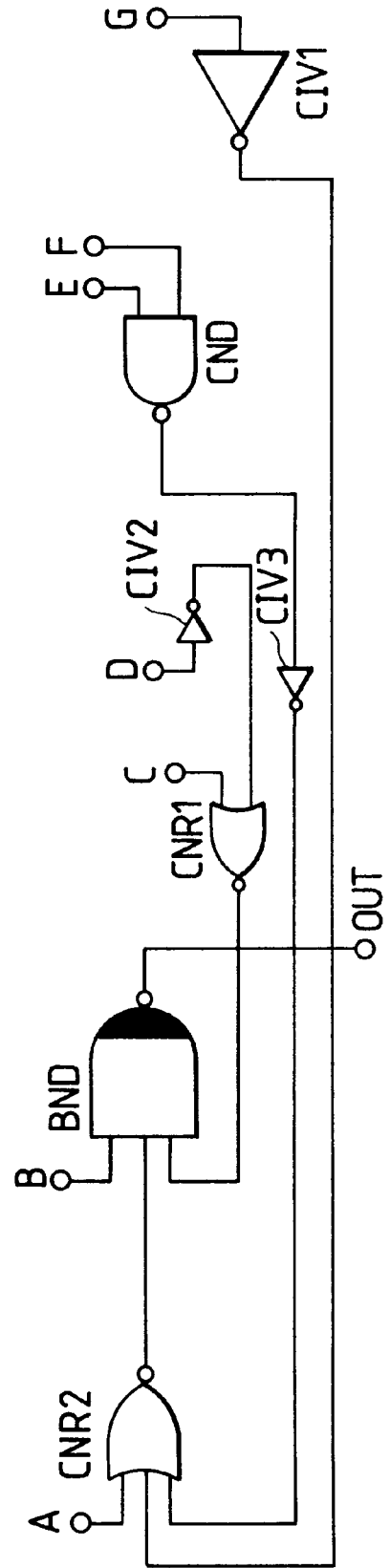
FIG. 9 is a logic circuit diagram corresponding to FIG. 8.

Referring to FIG. 8, there is shown a preferred embodiment of a logic circuit composed of the above-mentioned circuit blocks. Referring to FIG. 9, there is shown a logic circuit diagram corresponding to the embodiment of FIG. 8. In the embodiment of FIG. 8, the wiring inside a basic cell is constituted by a metal wiring layer such as a first tungsten layer indicated by dashed lines. The wiring between basic cells is constituted by metal layers such as second through fifth wiring layers mainly made of aluminum. A sixth metal wiring layer is used as a power supply wiring.

CNR2 of FIG. 8 provides a NOR gate circuit of CMOS constitution having three inputs including an input signal A of FIG. 9. BND of FIG. 8 provides an AND gate circuit having three inputs including an input signal B of FIG. 9. Output portions are constituted by bipolar transistors B1 and B3, and B2 and B4. NCR1 of FIG. 8 provides a NOR gate of CMOS constitution having two inputs including an input signal C of FIG. 9. CIV2 of FIG. 8 provides a CMOS inverter that receives an input signal D of FIG. 9. CIV3 of FIG. 8 provides a CMOS inverter of FIG. 9. CND of FIG. 8 provides a NAND gate of CMOS constitution having two inputs that receive input signals E and F of FIG. 9. CIV1 provides a CMOS inverter that receives an input signal G.

Figure 10:
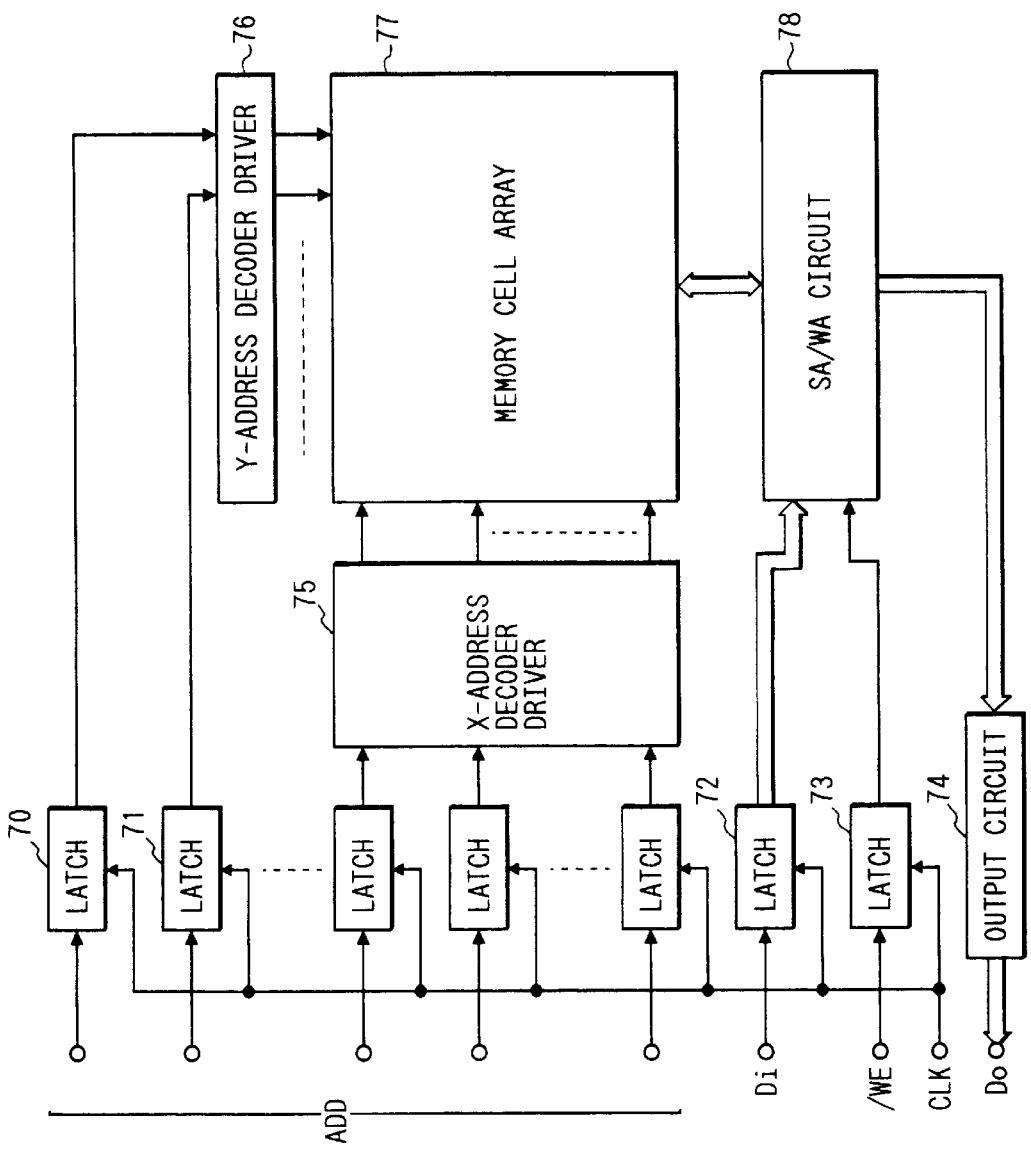
FIG. 10 is a schematic block diagram illustrating a preferred embodiment of a memory block mounted on a semiconductor integrated circuit device associated with the present invention.

Referring to FIG. 10, there is shown a schematic block diagram illustrating a preferred embodiment of a memory block to be mounted on the semiconductor integrated circuit device associated with the present invention. A memory cell array 77 is composed of CMOS memory cells arranged in a matrix as mentioned above. A complementary bit line of the memory cell array 77 is selected by a select signal generated by Y-address decoder driver 76. A word line of the memory cell array 77 is selected by an X-address decoder driver.

The selected complementary bit line of the memory cell array 77 is connected to a sense amplifier SA and a write amplifier WA. That is, if a control signal /WE captured by a latch 73 is high, the sense amplifier is made active to amplify stored information read onto the selected complementary bit line and outputs the amplified information from an output terminal Do via an output circuit 74. If the above-mentioned control signal /WE is low, the write amplifier WA is made active to write data captured by a latch 72 to a memory cell via the selected complementary bit line.

Output signals of latches 70 and 71 that capture an address signal ADD are transmitted to the above-mentioned Y-address decoder driver 76 and X-address decoder driver 75. These latches 70 and 71, and the latch 72 that captures the above-mentioned write data Di, and the latch 73 that captures the control signal /WE each captures an input signal in synchronization with a clock signal CLK. That is, a RAM practiced as this embodiment is adapted to perform a read/write operation in synchronization with the clock CLK.

The following advantages can be obtained from the above-mentioned embodiments of the present invention.

There is provided a plurality of first logic circuit blocks composed of basic cells arranged in an array; A pair of memory blocks is provided so that these memory blocks are constituted having integrity with the above-mentioned blocks in layout and input/output portions of these memory blocks are arranged oppositely; and a second logic circuit block is formed in an area between the memory blocks to transfer signals with the above-mentioned input/output portions. This novel setup allows the memory blocks to be set at any location relative to the logic circuit blocks, thereby providing efficient layout design. Also, because a logic circuit block is formed between a pair of memory blocks to compare data of both memory blocks or transfer data between them over a shortest distance, the processing speed of the semiconductor integrated circuit device according to the invention is substantially increased.

The area between the pair of memory blocks is formed with input/output pins to be connected to the input/output portions of the memory blocks, thereby transferring data with an external circuit over a shortest distance. The processing speed is increased still further.

The second logic circuit block formed in the area between the pair of memory blocks is composed of a gate array similar to those used in the first logic circuit blocks, thereby making it convenient to provide integrity with the memory blocks and making it possible to add a variety of logic functions to the memory blocks.

While the preferred embodiments of the present invention have been described using specific terms, such description is for illustrative purposes only, and it is to be understood that changes and variations may be made without departing from the spirit or scope of the appended claims. For example, for the memory blocks, ROM macro cells are available in addition to RAM. The ROM macro cells can be handled in the same manner as RAM macro cells. As for the logic circuit blocks, such circuits having a specific function as the arithmetic unit can be made macro cells to be handled in the same manner as the above-mentioned RAM or ROM macro cells.

The semiconductor integrated circuit device associated with the present invention is widely applicable to a variety of semiconductor integrated circuit devices for specific purposes mounted with memory blocks based on gate arrays. In such a case, the gate arrays may be CMOS, a combination of CMOS circuit and bipolar transistor, ECL gate arrays or TTL gate arrays.

Figure 11:
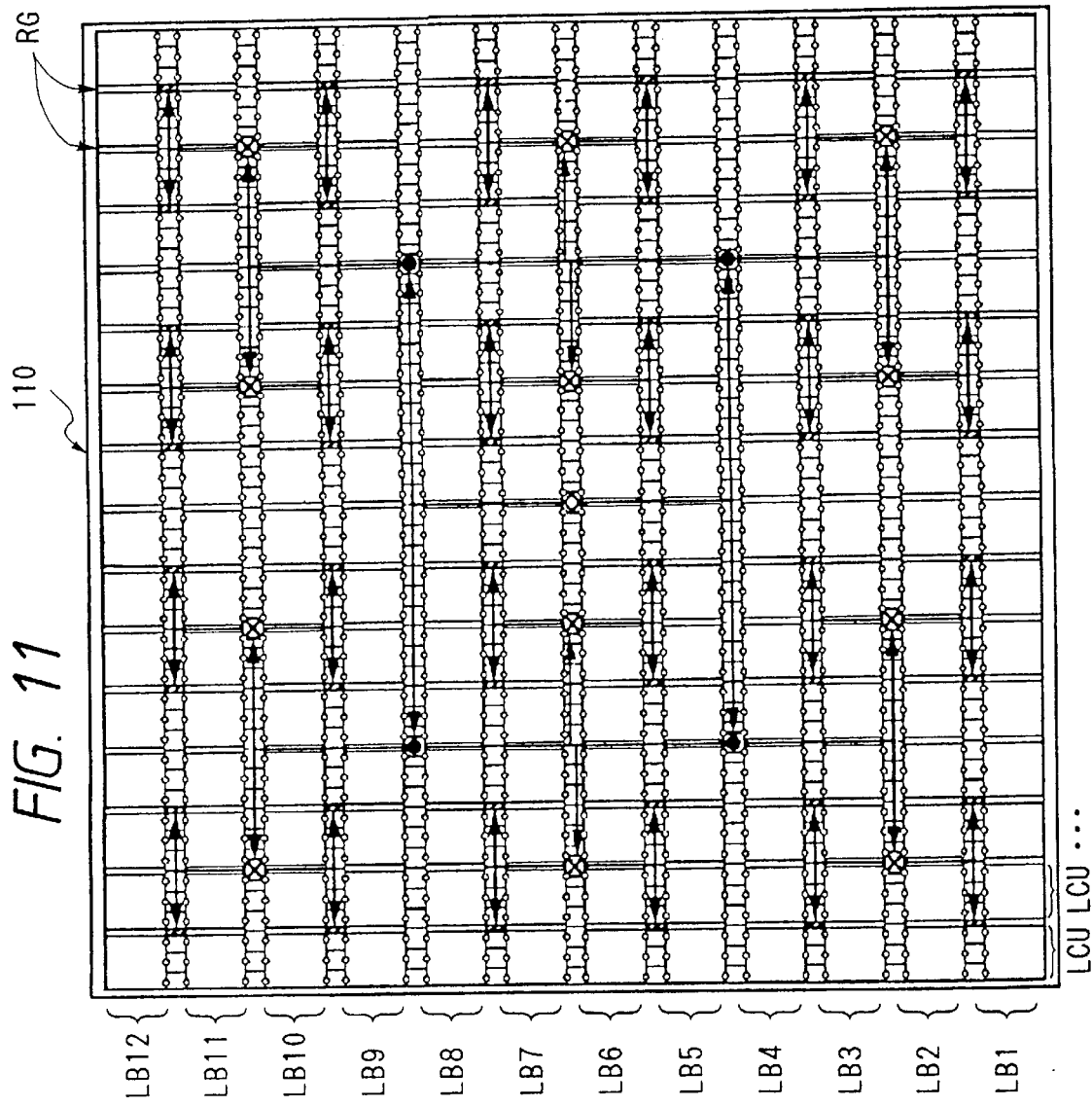
FIG. 11 is a device top layout diagram illustrating a semiconductor integrated circuit device having a gate array constitution associated with the present invention.

Referring to FIG. 11, there is shown a schematic diagram illustrating a preferred embodiment of the semiconductor integrated circuit device (logic LSI) associated with the present invention. For ease of understanding, the figure presents a schematic diagram of a base chip 110 composed of gate arrays.

The base chip 110 is formed on a main surface thereof with a logic circuit portion including logic circuit rows LB1 through LB12 and a plurality of stripe-like I/O rows laterally running through the above-mentioned logic circuit portion. A clock signal is distributed from the center of the chip toward its peripheries in correspondence with symbols indicated in a clock distribution system, but not limited thereto. Two clock lines extend from an output of a first clock distributing circuit (first stage clock amplifier) provided at the center of the base chip and indicated with a white circle to upper and lower portions (in the figure, directions at right angles to the I/O rows) of the base chip. At an intermediate portion, the clock lines branch in left and right directions (parallel to the I/O rows), resulting in four clock lines to be led to a total of four second clock distributing circuit (second stage clock amplifiers) indicated by four black dots.

Of the above-mentioned four second clock distributing circuits, attention should be paid to a lower left circuit. From the lower left circuit, the clock line extends up and down. The down-going lines branch right and l eft to be led to two third clock distributing circuits (third stage clock amplifiers) indicated by "x". The up-going clock line is led left to one third clock distributing circuit indicated by "x". Likewise, of the above-mentioned four second clock distributing circuits, a lower right circuit provides clock lines to be led to three third clock distributing circuits. Routes extending from two second clock distributing circuits provided in an upper half of the base chip to third clock distributing circuits are arranged in point-symmetrical to the lower half of the base chip. Thus, there are 12 third clock distributing circuits in total.

From each of the third clock distributing circuits indicated by "x", clock lines extend up and down to be branched left and right, eventually being connected to a total of four final clock distributing circuits. Each of the final clock distributing circuits supplies clock pulses to upper two internal gates (logic circuits) and lower two internal gates, amounting to four internal gates. Since each of 12 third clock distributing circuits has the four final clock distributing circuits, there are 48 final clock distributing circuits in total. From an output of each of these final clock distributing circuits, a clock pulse is supplied to a flip-flop FF or other logic circuit. Since the flip-flops and other logic circuits formed on the base chip of this embodiment are applied with clock pulses over equidistant clock wirings running from the first clock distributing circuit provided at the center of the base chip, there is no skew (time lag) between the clocks supplied to the logic circuits, thereby allowing the chip to operate at a relatively high speed.

Further, as mentioned above, the logic circuit rows are provided with I/O rows in between. Each of the logic circuit rows LB1 through LB12 contains a plurality of logic circuit cell units (LCUs). A power generator RG is provided between the LCUs. An area over the power generator RG is used as a wiring channel. White circles provided along the above-mentioned I/O rows indicate input/output terminals through which signals are entered and outputted. Although not shown, external terminals for power supply are also provided over the logic circuit rows LB1 through LB12. These external terminals are arranged on the entire chip in arrays as will be described later and connected to a mounting board such as a printed circuit board by CCB (Controlled Collapse Bonding).

Figure 12:
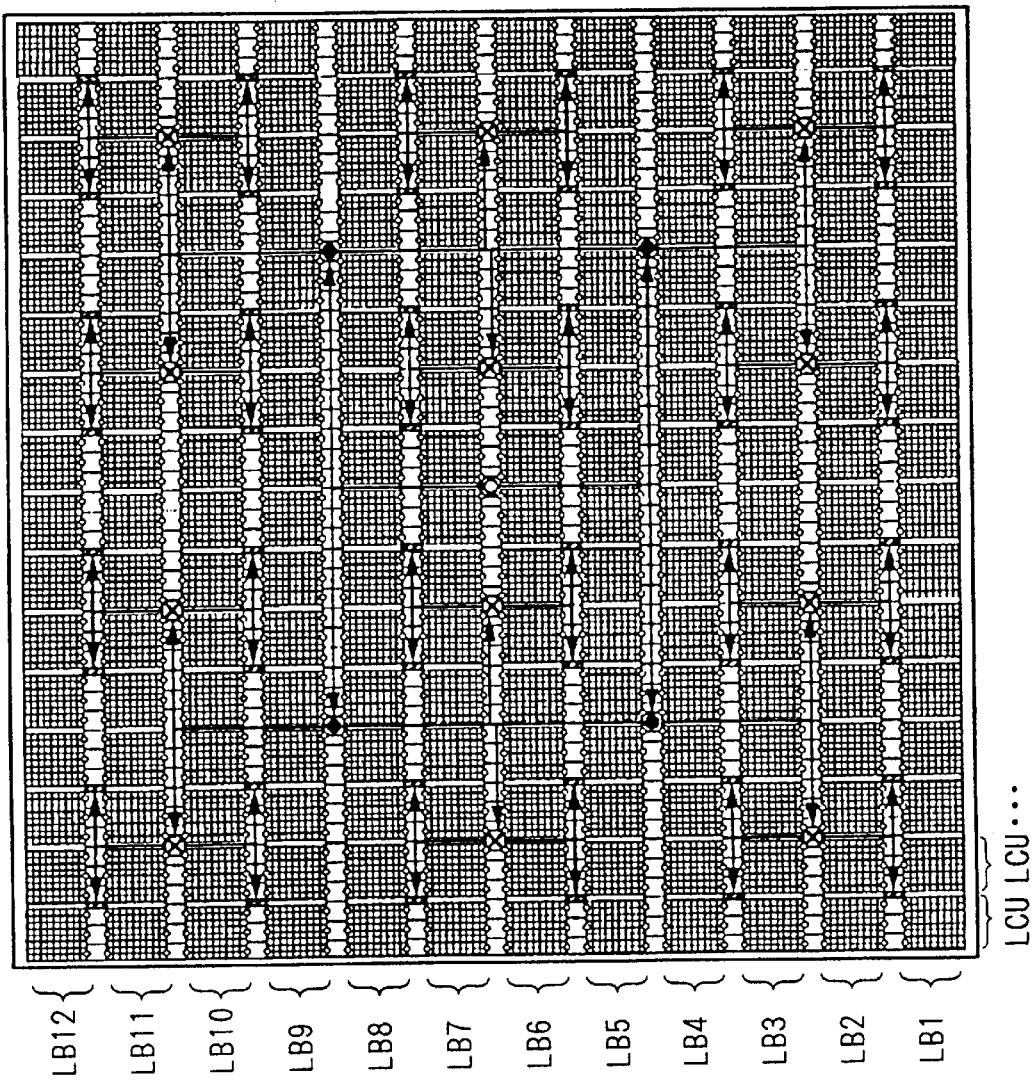
FIG. 12 is a schematic block diagram illustrating a preferred embodiment of a semiconductor integrated circuit device having a gate array constitution associated with the present invention.
Figure 13:
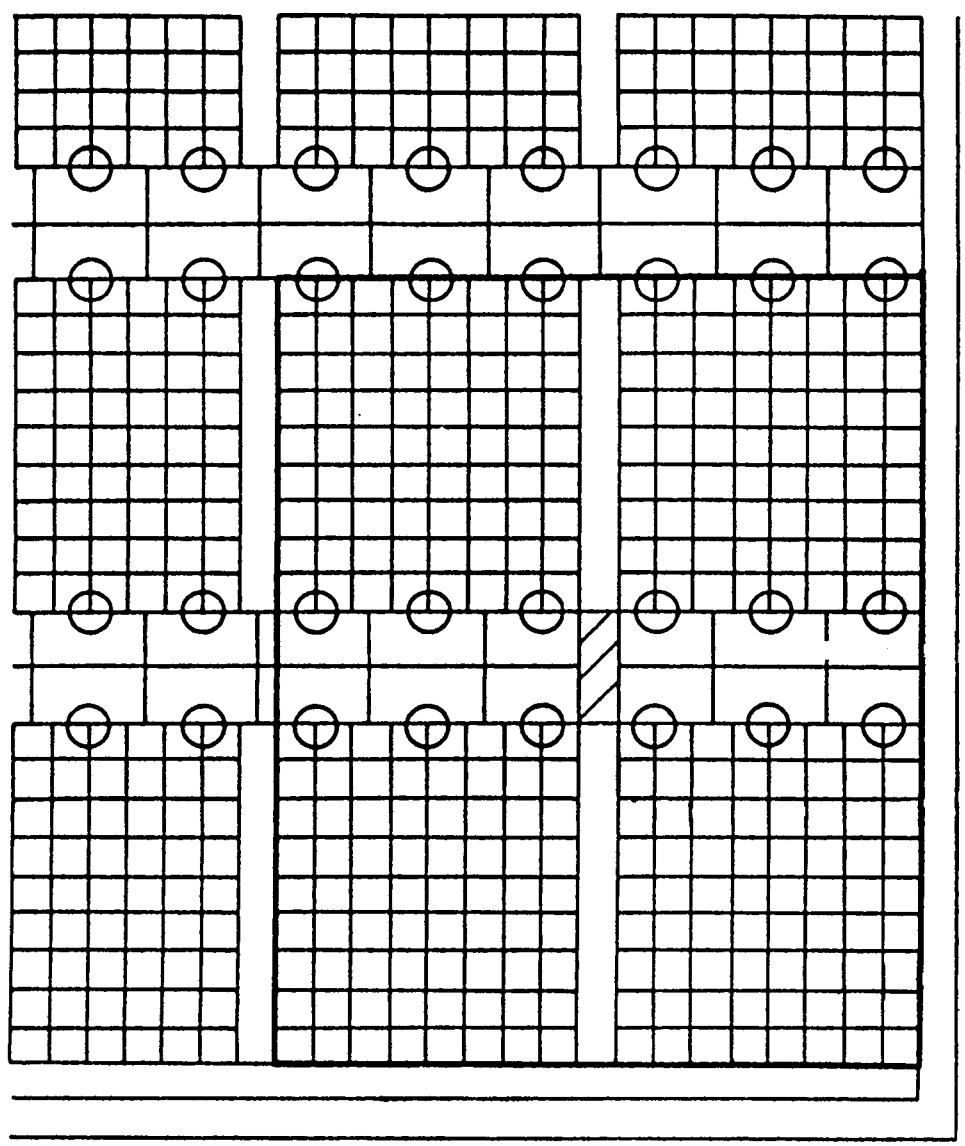
FIG. 13 is a partial expanded view of FIG. 12.

Referring to FIG. 12, there is shown a layout of another preferred embodiment of the semiconductor integrated circuit device associated with the present invention. Referring to FIG. 13, there is shown a expanded view of a part of the embodiment. In this embodiment, a base chip is composed of gate arrays in its entirety.

Four internal gate arrays or logic circuit cell units (LCUS) to which clocks are supplied from the above-mentioned final clock distributing circuits are, as shown in FIG. 13, provided with a clock amplifier as a final stage clock distributing circuit provided at a center of the base chip. Through this clock amplifier, clock pulses are supplied to the four internal gate arrays arranged at upper left and right and lower left and right areas of the chip.

As shown in FIG. 13 in detail, each of the gate arrays is composed of 8×9 unit circuits (basic cells). Each unit circuit is composed of a CMOS scan circuit for fault diagnosis by random scan to be described later and an ECL circuit at the center, and areas for four circuits arranged over and below these circuits.

In FIGS. 12 and 13, the four internal gate arrays arranged in upper left and right and lower left and right areas around the final stage clock distributing circuit (clock amplifier) and an area composed of an I/O row horizontally running across the internal gate arrays make a basic macro cell. That is, an area for which one final stage clock distributing circuit supplies clock pulses provides a basic macro cell.

Figure 14:
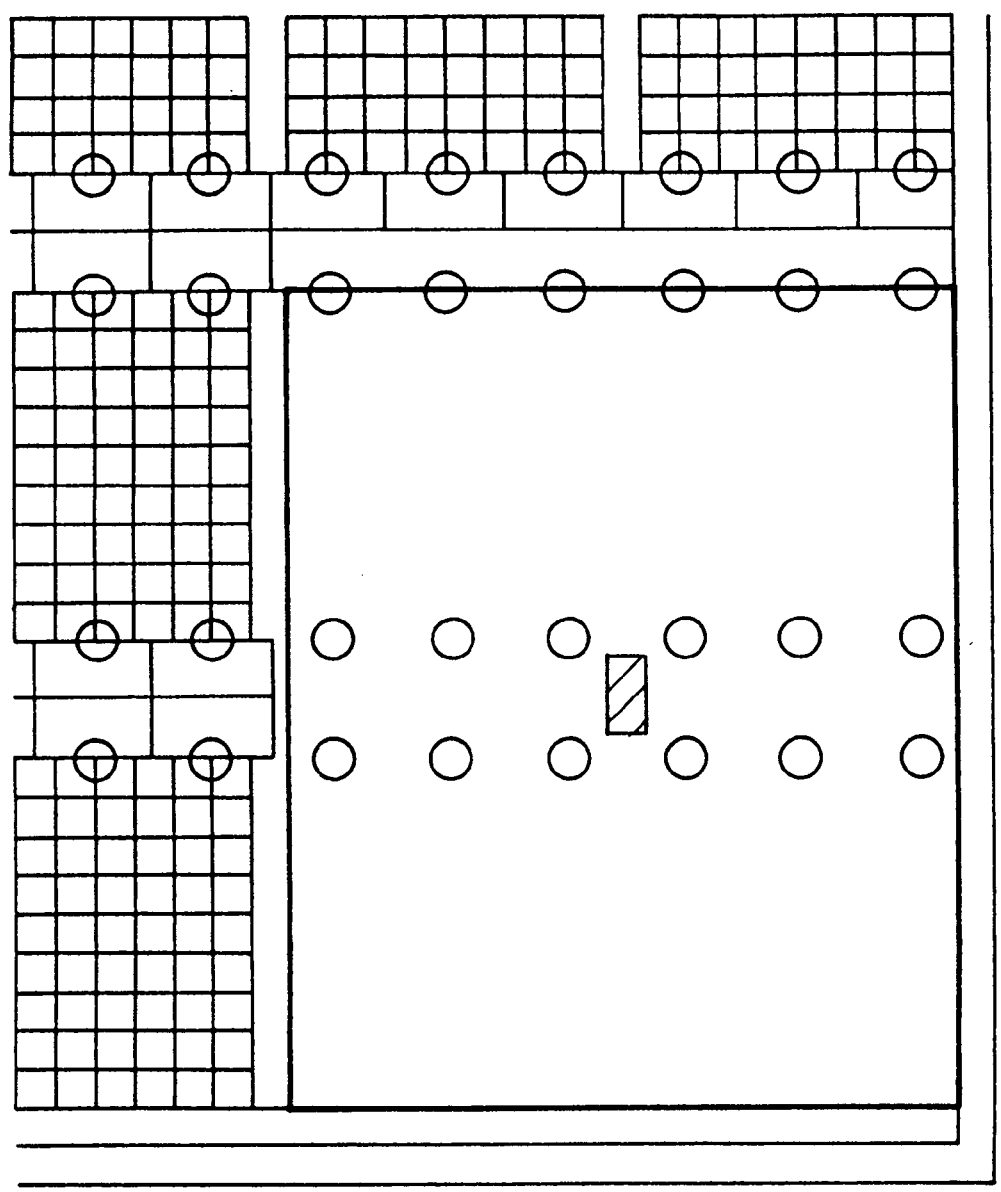
FIG. 14 is top view illustrating a main portion in which a logic circuit block is partially replaced with a RAM macro cell.

Referring to FIG. 14, there is shown a diagram illustrating a constitution of a RAM macro cell associated with the present invention. As shown in the figure, a RAM macro cell is formed in correspondence with four internal gate arrays such as those mentioned above and a corresponding area composed of an I/O row. The RAM macro cell is composed of a static memory cell containing a pair of CMOS inverters with their input and output cross-coupled, but not limited thereto, thereby enhancing integration and power saving. This setup can create a RAM having a relatively large storage size for a relatively small area.

That is, by using a device constituted for one circuit constituting a gate array as mentioned above, flip-flop circuits and their selecting circuit can be formed to form a memory cell. However, use of a memory array composed of CMOS circuits such as those mentioned above allows to efficiently form a RAM having far large storage size for the same area than that of the above-mentioned memory cell. The RAM macro cell of this embodiment is provided at a center thereof with a clock amplifier. Around the clock amplifier, data input/output circuits and address select circuits are provided. Peripheral circuits such as address select circuits are formed in areas corresponding to the I/O rows. The memory cell arrays are formed in areas corresponding to the internal gate arrays.

Figure 15:
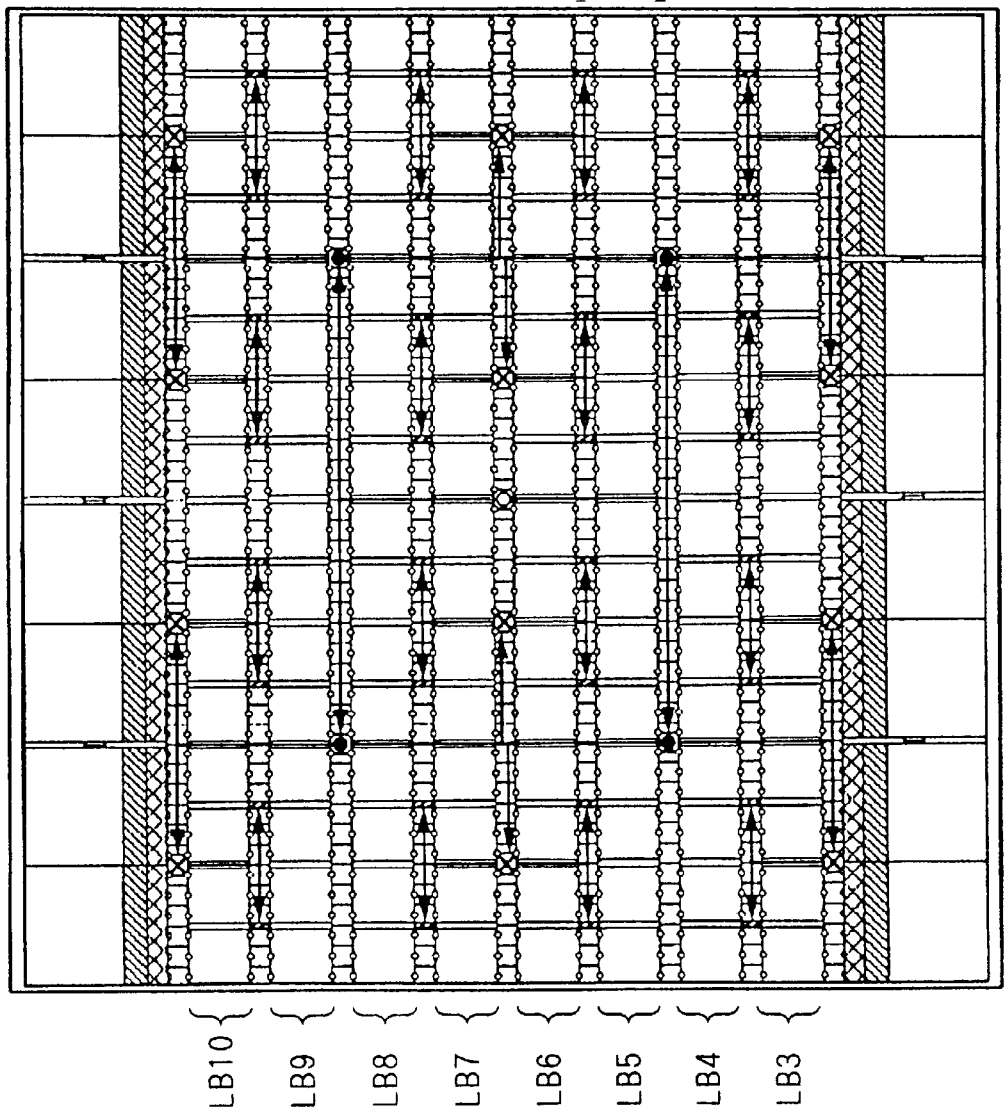
FIG. 15 is a schematic diagram illustrating a preferred embodiment of a semiconductor integrated circuit device composed of a gate array portion and a RAM portion.

Referring to FIG. 15, there is shown a schematic diagram illustrating a preferred embodiment of a semiconductor integrated circuit device composed of a combination of a gate array portion and a RAM portion. In this embodiment, a row of RAM macro cells each having the size of FIG. 14 is arranged in upper and lower portions of a chip. One RAM macro cell is composed of the above-mentioned four internal gate arrays or logic circuit cell units (LCUs) and a corresponding I/O row.

Unlike the RAM macro cell of FIG. 14, the RAM macro cell of FIG. 15 is provided with peripheral circuits in correspondence with an adjacent I/O row. The peripheral circuits include a write pulse generator and an address selector of ECL type.

In the above-mentioned setup, a clock distributing system is substantially the same as those of FIGS. 11 and 12. That is, there are four second stage clock distributing circuits, 12 third stage clock distributing circuits, and 48 final stage clock distributing circuits. However, the clock wirings in the RAM macro cell portion are not always of the same pattern as that of the gate array RAM macro cell. In the RAM macro cell of FIG. 15, the wirings are made to locations requiring clocks with substantially the same wiring length. Consequently, it is possible to supply clocks to the RAM macro cell directly from the third stage clock distributing circuits; actually, however, the clocks are supplied via the equidistant clock wirings and the final stage clock distributing circuits.

Figure 16:
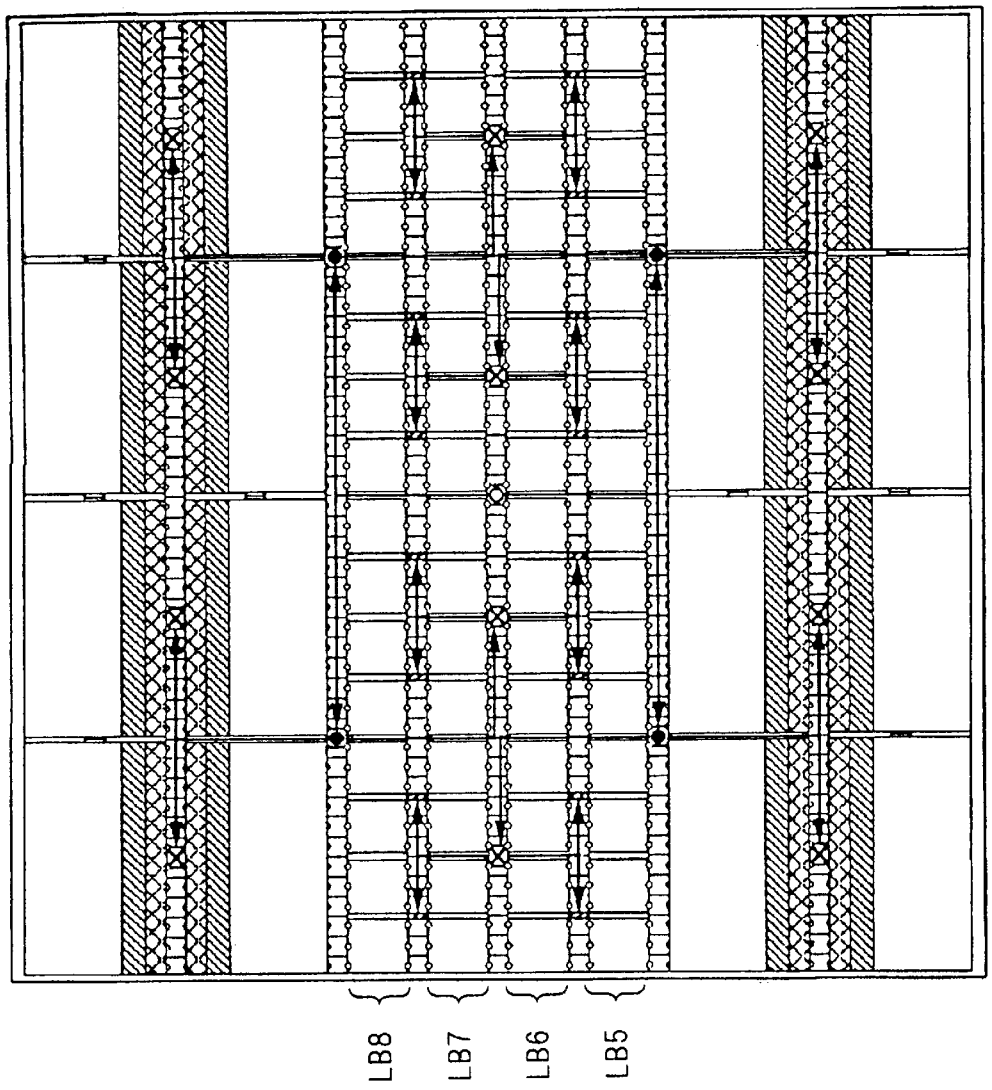
FIG. 16 is a schematic diagram illustrating another preferred embodiment of the semiconductor integrated circuit device composed of a gate array portion and a RAM portion.

Referring to FIG. 16, there is shown a schematic diagram illustrating another preferred embodiment of the semiconductor integrated circuit device composed of the combination of the gate array portion and the RAM portion. In this embodiment, a row of RAM macro cells each being as large as two RAM macro cells of FIG. 14 is arranged upper and lower portions of a chip.

Also, in the larger RAM macro cell, in order to provide a clock distributing system substantially the same as that of a RAM macro cell entirely composed of gate arrays, logic circuits and input/output circuits both constituting peripheral circuits are arranged in an area between the two rows of RAM macro cells. On the logic circuits and input/output circuits, third stage clock distributing circuits indicated by "x" are provided. Clocks are supplied from these circuits to final stage clock distributing circuits over clock wirings generally similar in length to clock wirings of final stage clock distributing circuits. This setup allows the clock distributing system of the semiconductor chip of FIG. 16 to be substantially equivalent to those of FIGS. 11 and 12.

Figure 17:
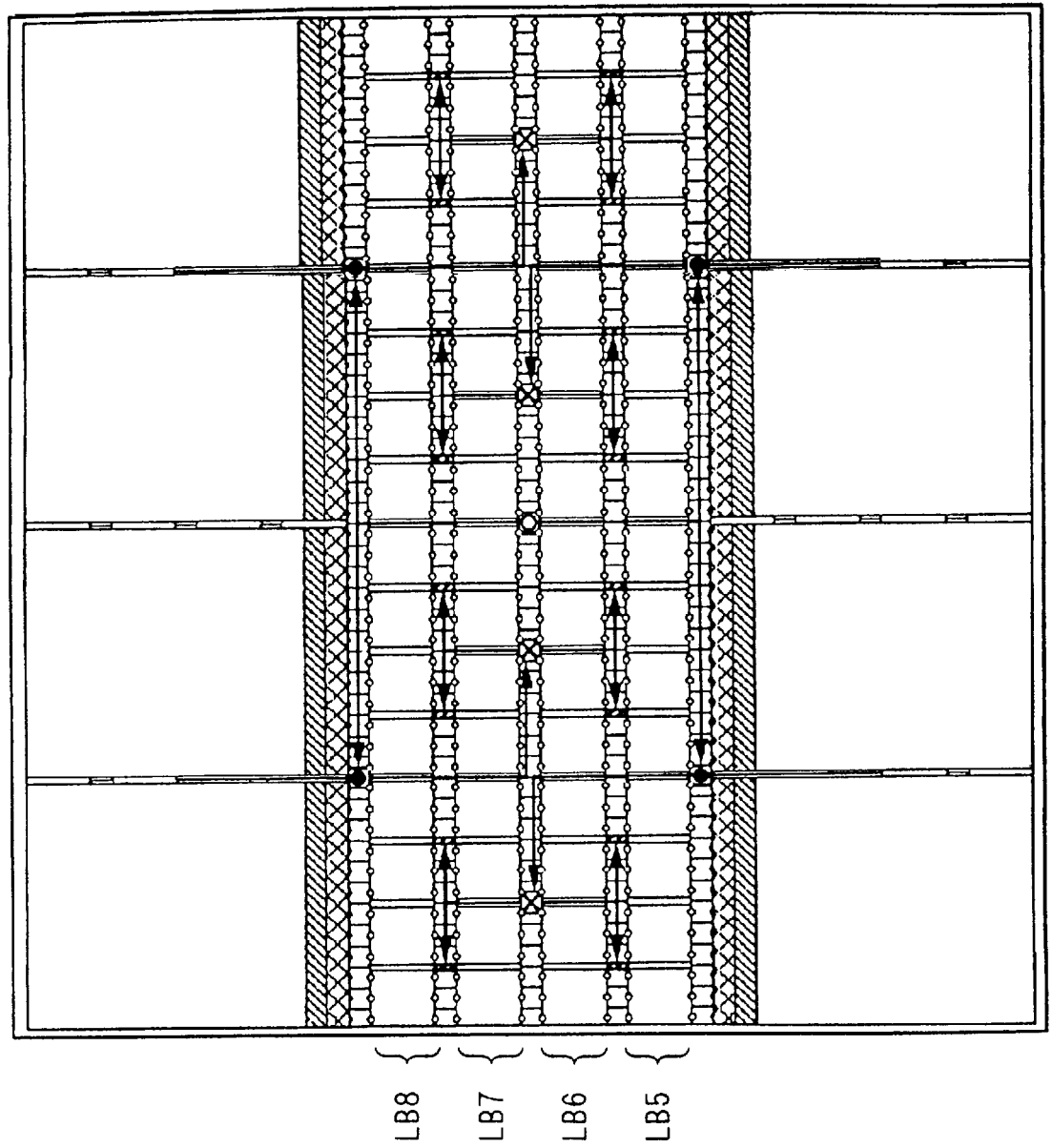
FIG. 17 is a schematic diagram illustrating still another preferred embodiment of the semiconductor integrated circuit device composed of a gate array portion and a RAM portion.

Referring to FIG. 17, there is shown a schematic diagram illustrating still another preferred embodiment of the semiconductor integrated circuit device composed of the combination of the gate array portion and the RAM portion. In this embodiment, a row of RAM macros each being as large as four RAM macro cells of FIG. 14 is arranged in upper and lower portion of a chip.

Also, in the still larger RAM macro cell, in order to provide a clock distributing system substantially the same as that of a RAM macro cell entirely composed of gate arrays of FIG. 11, clocks are not supplied directly from second stage clock distributing circuits indicated by black dots, but via, as it were, dummy third clock distributing circuits and final stage clock distributing circuits provided at proper locations on peripheral circuits. This setup allows the clock distributing system of the semiconductor chip of FIG. 17 to be substantially equivalent to those of FIGS. 11 and 12.

In place of the minimum-unit RAM macro cells of FIGS. 14 and 15, RAM macro cells having sizes equal to an integral multiple of the minimum-size RAM macro cell can be used to provide an efficient memory cell layout, thereby increasing a storage capacity in a unit area. That is, the above-mentioned novel setup allows the storage capacity in increments of the unit macro cell.

Figure 18B:
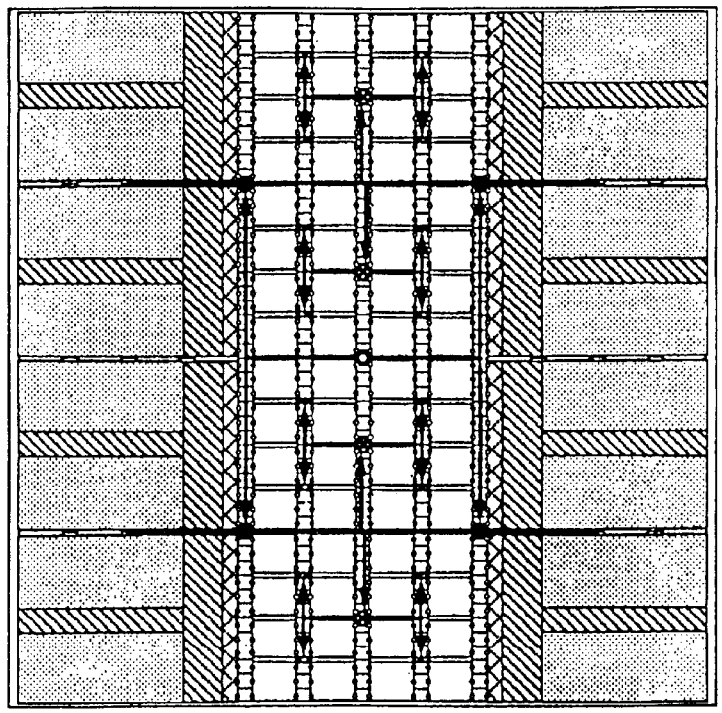
FIG. 18 is a schematic diagram illustrating yet another preferred embodiment of the semiconductor integrated circuit device composed of a gate array portion and a RAM portion.
Figure 18A:
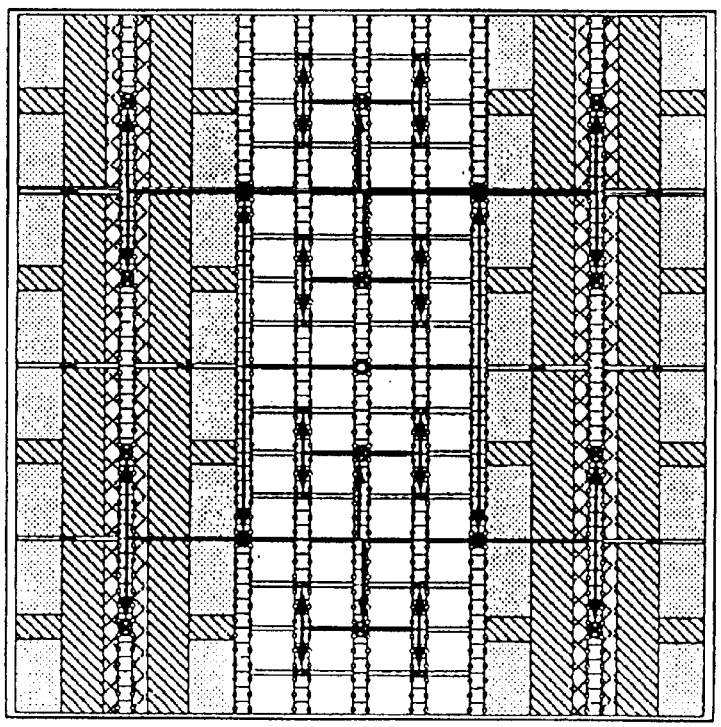

Referring to FIG. 18, there is shown a schematic diagram illustrating yet another preferred embodiment of the semiconductor integrated circuit device composed of the combination of the gate array portion and the RAM portion. In this embodiment, two RAM macro cells are mounted such as RAM1 and RAM2. The RAM1 and the RAM2 are the same in size but different in a layout of their memory cell arrays and peripheral circuits. A clock distributing system of this embodiment is the same as that of the embodiment of FIG. 17.

For the RAM macro cell of this embodiment, a CMOS memory cell is used. In order to enhance a operational speed of a chip, peripheral circuits such as an address select circuit are made up of ECL circuits. Consequently, an area occupied by the peripheral circuits is larger than that on the RAM macro cells of FIGS. 15 through 17.

In this embodiment, integrity is provided between the memory portion and the gate array portion formed on the same chip. This eliminates a wasted area on the semiconductor chip, realizes a efficient layout, and enhances a design efficiency. A clock distributing system of the embodiment can be made substantially the same as those of FIGS. 15 through 17. This setup expands an operating margin of the chip, thereby facilitating circuit design.

In the above-mentioned embodiments, the semiconductor integrated circuit devices are made up of gate arrays and RAM macro cells. The RAM macro cell portion may be replaced with logic macro cells. The logic macro cell is a cell having a particular circuit function and is composed of general-purpose circuits such as an arithmetic circuit and a register group. By using such general-purpose circuits as the logic macro cell and making a size of the logic macro cell correspond to the above-mentioned clock distributing system, the semiconductor integrated circuit device can be laid out efficiently and its design and circuit design can be simplified.

Figure 19:
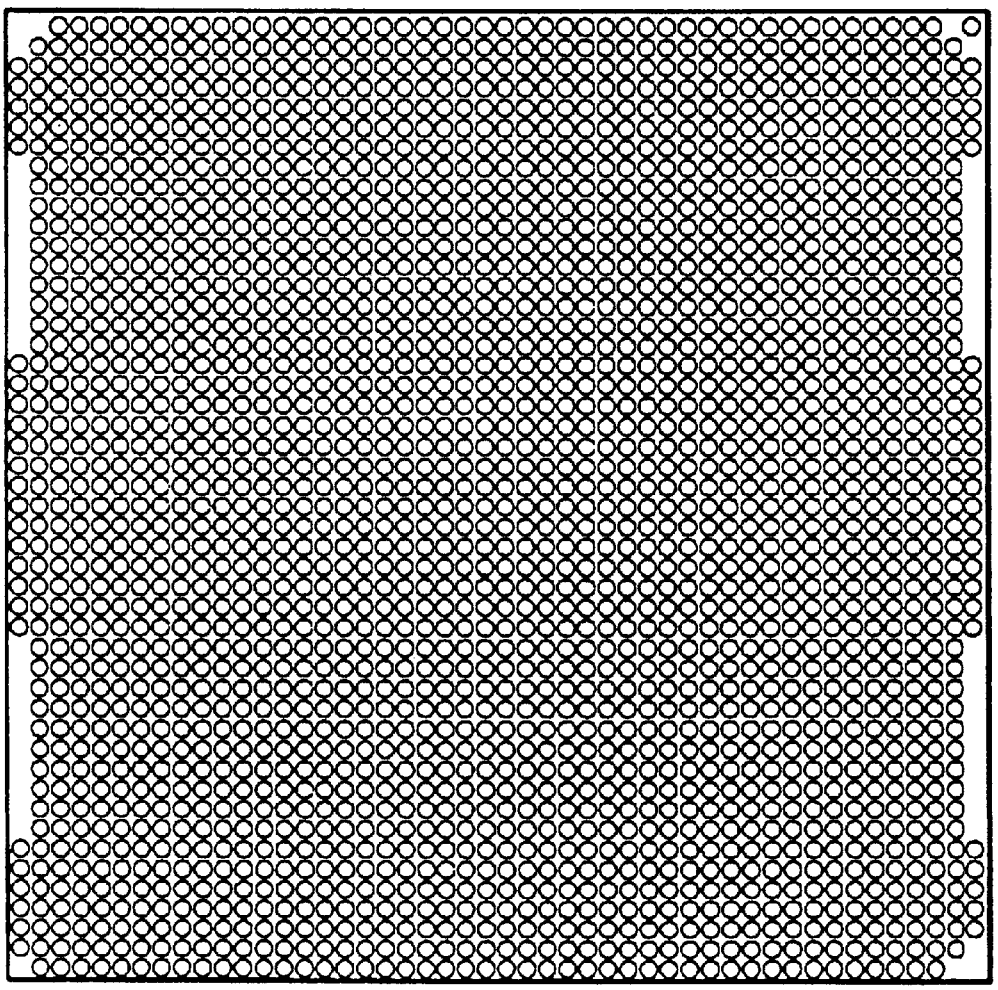
FIG. 19 is a pin assignment diagram illustrating a preferred embodiment of a semiconductor integrated circuit device associated with the present invention.

Referring to FIG. 19, there is shown a pin assignment of one preferred embodiment of the semiconductor integrated circuit device associated with the present invention. A circle indicates a pin. The pins provide input pins for supplying input signals, output pins for supplying output signals, and power pins. The above-mentioned clock is supplied from a center pin. The power pins are appropriately provided at locations corresponding to the above-mentioned power supply rows. External pins of this embodiment are connected to a mounting board such as a printed circuit board by the above-mentioned CCB.

In the semiconductor integrated circuit device having the above-mentioned logic functions, the number of input/output pins increases up to several hundreds. With a logic LSI having so many input/output pins, it is difficult to diagnose internal logic circuits. For example, when testing a logic LSI with a probe, it is very difficult to correctly contact the probe to all terminals (pads) because, as the number of input/output pins (terminals) increases, intervals between the terminals get narrower. Especially, with the above-mentioned LSI of CCB type, intervals between the terminals are relatively short, making it difficult to correctly touch a probe to all pads.

Serial scanning is also known as a logic circuit diagnosis method. In this method, a plurality of flip-flop circuits in a logic LSI under test are connected in series to make them work as a shift register. That is, when testing the logic LSI, a plurality of flip-flops are connected so that they work as a shift register. Test data is written to each flip-flop that constitutes the shift register. Then, each flip-flop circuit is connected so that it works in a normal operation, thereby allowing the test data to be supplied to a logic circuit that follows the flip-flop circuit. Next, the logic LSI is operated so that the test data is supplied to the following logic circuit.

The following logic circuit executes a predetermined logic operation according to test data. The resultant data (test result data) is latched to a plurality of flip-flop circuits in the following logic circuit. By connecting the flip-flop circuits so that they work as a shift register as mentioned above, the test result data is outputted to a tester externally connected to the logic LSI.

Consequently, according to the above-mentioned serial scan method, it is easy to test the logic circuit that follows each flip-flop circuit. However, testing logic circuits between an input circuit and the first flip-flop circuit requires to enter a test signal by touching a probe to an input terminal.

For solving this problem, a method is known in which a boundary scan flip-flop circuit is provided on the input portion of the logic LSI to hold test data (a test pattern) in a flip-flop circuit at testing, thereby eliminating use of a probe. In "IEEE 1990 Bipolar Circuit and Technology Meeting 6,2," pp. 122 to 131, a technique is disclosed in which a boundary scan flip-flop is constituted by combining an ECL circuit and a CMOS (complementary MOS) circuit. The CMOS scan circuit and the ECL circuit of FIG. 13 can be used as such a boundary scan flip-flop.

For still another diagnostic method, random scanning is known in which each flip-flop in the semiconductor integrated circuit device can be addressed at testing. This addressing is a difference from the above-mentioned serial scanning.

In the random scan method, one of the flip-flop circuits in the semiconductor integrated circuit device is selected based on an externally supplied address signal. And test data is set to the selected flip-flop or test is read from it. The random scan method such as this is described in U.S. Pat. No. 4,701,922. In the semiconductor integrated circuit device according to the present invention, a diagnostic capability with the above-mentioned boundary scan flip-flop and the random scan method combined is added, but not limited thereto. That is, the CMOS scan circuit and the ECL circuit in the above-mentioned internal gate array are used for this purpose.

Advantages obtained from the embodiments of FIGS. 11 through 19 include the following.

A clock signal entered at the center portion of the semiconductor chip is supplied to a plurality of first stage clock distributing circuits equidistantly disposed from the center portion. The clock signal is then supplied to a plurality of second stage clock distributing circuits at least equidistantly disposed from each of the first stage clock distributing circuits. The clock signal is then supplied to a plurality of third stage clock distributing circuits equidistantly disposed from each of the second stage clock distributing circuits. The clock signal is then supplied to a plurality of final stage clock distributing circuits equidistantly disposed from each of the third stage clock distributing circuits. From these final stage clock distributing circuits, the clock signal is supplied to an area. An internal gate array and a RAM macro cell or a logic macro cell are made replaceable with each other in units of this area. This setup allows circuits such as flip-flops that are driven by clock pulse to operate in synchronization because there is no difference in a clock signal delay between the circuits, thereby increasing the operating speed of the chip. Also, the above-mentioned setup provides high integrity in combinations of a gate array and a RAM macro cell having specific function or a logic macro cell because they are the same in size, thereby realizing circuit layout with efficiency.

Further, the internal gate array and the RAM macro cell or logic macro cell can be laid out with integrity, thereby facilitating layout design.

Still further, the clock can be distributed to all circuits without skew in between and therefore there is no need for considering the clock skew in circuit design, thereby simplifying circuit design.

While the preferred embodiments of the present invention have been described using specific terms, such description is for illustrative purposes only, and it is to be understood that changes and variations may be made without departing from the spirit or scope of the appended claims. For example, a ROM macro cell can be prepared beforehand to handle it in the same manner as a RAM macro cell or a logic macro cell. For the clock distributing system, any can be used if it is branched into a plurality of distributing systems each having substantially the same constitution as those of several of the above-mentioned embodiments.

It will be apparent that the semiconductor integrated circuit device associated with the present invention can be embodied in various other manners such as using CMOS or other logic gates in addition to the ECL gate array.

Advantages to be provided by a representative example disclosed herein will be outlined as follows. A clock signal entered at the center portion of the semiconductor chip is supplied to a plurality of first stage clock distributing circuits equidistantly disposed from the center portion. The clock signal is then supplied to a plurality of second stage clock distributing circuits at least equidistantly disposed from each of the first stage clock distributing circuits. The clock signal is then supplied to a plurality of third stage clock distributing circuits equidistantly disposed from each of the second stage clock distributing circuits. The clock signal is then supplied to a plurality of final stage clock distributing circuits equidistantly disposed from each of the third stage clock distributing circuits. From these final stage clock distributing circuits, the clock signal is supplied to an area. An internal gate array and a RAM macro cell or a logic macro cell are made replaceable with each other in units of this area. This setup allows circuits such as flip-flops that are driven by clock pulse to operate in synchronization because there is no difference in a clock signal delay between the circuits, thereby increasing the operating speed of the chip. Also, the above-mentioned setup provides high integrity in combinations of a gate array and a RAM macro cell having specific function or a logic macro cell because they are the same in size, thereby realizing circuit layout with efficiency.

What is claimed is:

1. A semiconductor integrated circuit device comprising:

a semiconductor substrate having a main surface;

a first logic circuit block formed on a first portion of said main surface of said semiconductor substrate;

a second logic circuit block formed on a second portion of said main surface of said semiconductor substrate, said second portion being different from said first portion, each of said first and second logic circuit blocks including a plurality of basic cells arranged in row and column directions; and first and second memory blocks formed on said main surface of said semiconductor substrate, each of said first and second memory blocks including a plurality of memory cells, word lines, and data lines for selecting said plurality of memory cells;

wherein said second logic circuit block is arranged, in a first direction, between said first and second memory blocks, the first direction being parallel to one of the row and column directions;

wherein said data lines of each of said first and second memory blocks are coupled to said second logic circuit block;

wherein said first memory block is arranged, in said first direction, between said first logic circuit and said second logic circuit;

wherein said second logic circuit includes at a center portion thereof an input/output cell block; and wherein input/output terminals are provided along said input/output cell block to transfer a signal to an external device.

2. A semiconductor integrated circuit device according to claim 1, wherein each of said first and second logic circuit blocks comprises logic cell units each having a predetermined size in a second direction perpendicular to said first direction, and wherein, in said second direction, the size of each of said first and second memory blocks is an integral multiple of each of said logic cell units.

3. A semiconductor integrated circuit device according to claim 2, wherein each of said logic cell units comprises a predetermined number of said basic cells.

4. A semiconductor integrated circuit device according to claim 1, wherein said second logic circuit block has means for performing data processing for said first and second memory blocks, and wherein said input/output cell block has means for capturing data through said input/output terminals and means for outputting data through said input/output terminals.

5. A semiconductor integrated circuit device according to claim 2, wherein each of said first and said second memory blocks comprises memory portions arranged in said second direction, and wherein in said second direction, the size of each of said memory portions is an integral multiple of each of said logic cell units.

6. A semiconductor integrated circuit device according to claim 5, wherein said first logic circuit block is divided, in said first direction, into a plurality of logic circuit rows by input/output cell rows, wherein said input/output terminals are formed over said input/output cell blocks; and wherein further input/output terminals are formed over said input/output cell rows.

7. A semiconductor integrated circuit device according to claim 4, wherein said first logic circuit block is divided, in said first direction, into a plurality of logic circuit rows by input/output cell rows, wherein said input/output terminals are formed over said input/output cell blocks; and wherein further input/output terminals are formed over said input/output cell rows.

8. A semiconductor integrated circuit device according to claim 1, wherein said first logic circuit block is divided, in said first direction, into a plurality of logic circuit rows by input/output cell rows, wherein said input/output terminals are formed over said input/output cell blocks; and wherein further input/output terminals are formed over said input/output cell rows.

9. A semiconductor integrated circuit device according to claim 6, wherein said second logic circuit block has means for performing data processing for said first and second memory blocks, and wherein said input/output cell block has means for capturing data through said input/output terminals and means for outputting data through said input/output terminals.

10. A semiconductor integrated circuit device according to claim 1, wherein said input/output terminals are made of solder bumps.

11. A semiconductor integrated circuit device according to claim 7, wherein said input/output terminals and said further input/output terminals are made of solder bumps.

12. A semiconductor integrated circuit device according to claim 8, wherein said input/output terminals and said further input/output terminals are made of solder bumps.

13. A semiconductor integrated circuit device according to claim 9, wherein said input/output terminals and said further input/output terminals are made of solder bumps.

* * * * *